United States Patent
Kikitsu et al.

(10) Patent No.: US 12,265,141 B2
(45) Date of Patent: Apr. 1, 2025

(54) SENSOR AND INSPECTION DEVICE

(71) Applicant: KABUSHIKI KAISHA TOSHIBA, Tokyo (JP)

(72) Inventors: Akira Kikitsu, Yokohama Kanagawa (JP); Yoshihiro Higashi, Komatsu Ishikawa (JP); Satoshi Shirotori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 18/165,040

(22) Filed: Feb. 6, 2023

(65) Prior Publication Data

US 2024/0003999 A1     Jan. 4, 2024

(30) Foreign Application Priority Data

Jul. 4, 2022   (JP) ................................. 2022-107818

(51) Int. Cl.
     *G01R 33/09*      (2006.01)
     *G01R 33/00*      (2006.01)
     *H10N 50/10*      (2023.01)

(52) U.S. Cl.
     CPC ........ *G01R 33/093* (2013.01); *G01R 33/0011* (2013.01); *H10N 50/10* (2023.02)

(58) Field of Classification Search
None
See application file for complete search history.

(56) References Cited

U.S. PATENT DOCUMENTS

| | | | |
|---|---|---|---|
| 10,837,953 B2 | 11/2020 | Kikitsu et al. | |
| 2017/0212189 A1* | 7/2017 | Holm | G01R 33/0005 |
| 2018/0271395 A1 | 9/2018 | Iwasaki et al. | |
| 2019/0293735 A1* | 9/2019 | Ushioda | G01R 33/02 |
| 2019/0369172 A1 | 12/2019 | Kikitsu et al. | |
| 2022/0065955 A1 | 3/2022 | Kikitsu et al. | |

FOREIGN PATENT DOCUMENTS

| | | |
|---|---|---|
| JP | 2018-155719 A | 10/2018 |
| JP | 2019-207167 A | 12/2019 |
| JP | 6668176 B2 | 3/2020 |
| JP | 2022-37688 A | 3/2022 |

* cited by examiner

*Primary Examiner* — Jas A Sanghera
(74) *Attorney, Agent, or Firm* — Finnegan, Henderson, Farabow, Garrett & Dunner, LLP

(57) ABSTRACT

According to one embodiment, a sensor includes an element portion. The element portion includes a first magnetic member, a first opposing magnetic member, a first element, a second magnetic member, a second opposing magnetic member, a second element, a third element, and a fourth element. The first opposing magnetic member is separated from the first magnetic member in a first direction from the first magnetic member to the first opposing magnetic member. The first element includes a first magnetic layer, a first portion and a first other portion. The second opposing magnetic member is separated from the second magnetic member in the first direction. The second element includes a second magnetic layer, a second portion and a second other portion. The third element includes a third portion and a third other portion. The fourth element includes a fourth portion and a fourth other portion.

19 Claims, 21 Drawing Sheets

SENSOR AND INSPECTION DEVICE

CROSS-REFERENCE TO RELATED APPLICATIONS

This application is based upon and claims the benefit of priority from Japanese Patent Application No. 2022-107818, filed on Jul. 4, 2022; the entire contents of which are incorporated herein by reference.

FIELD

Embodiments described herein generally relate to a sensor and an inspection device.

BACKGROUND

For example, there is a sensor using a magnetic layer. It is desired to improve the characteristics of the sensor.

DETAILED DESCRIPTION

Figure 1:
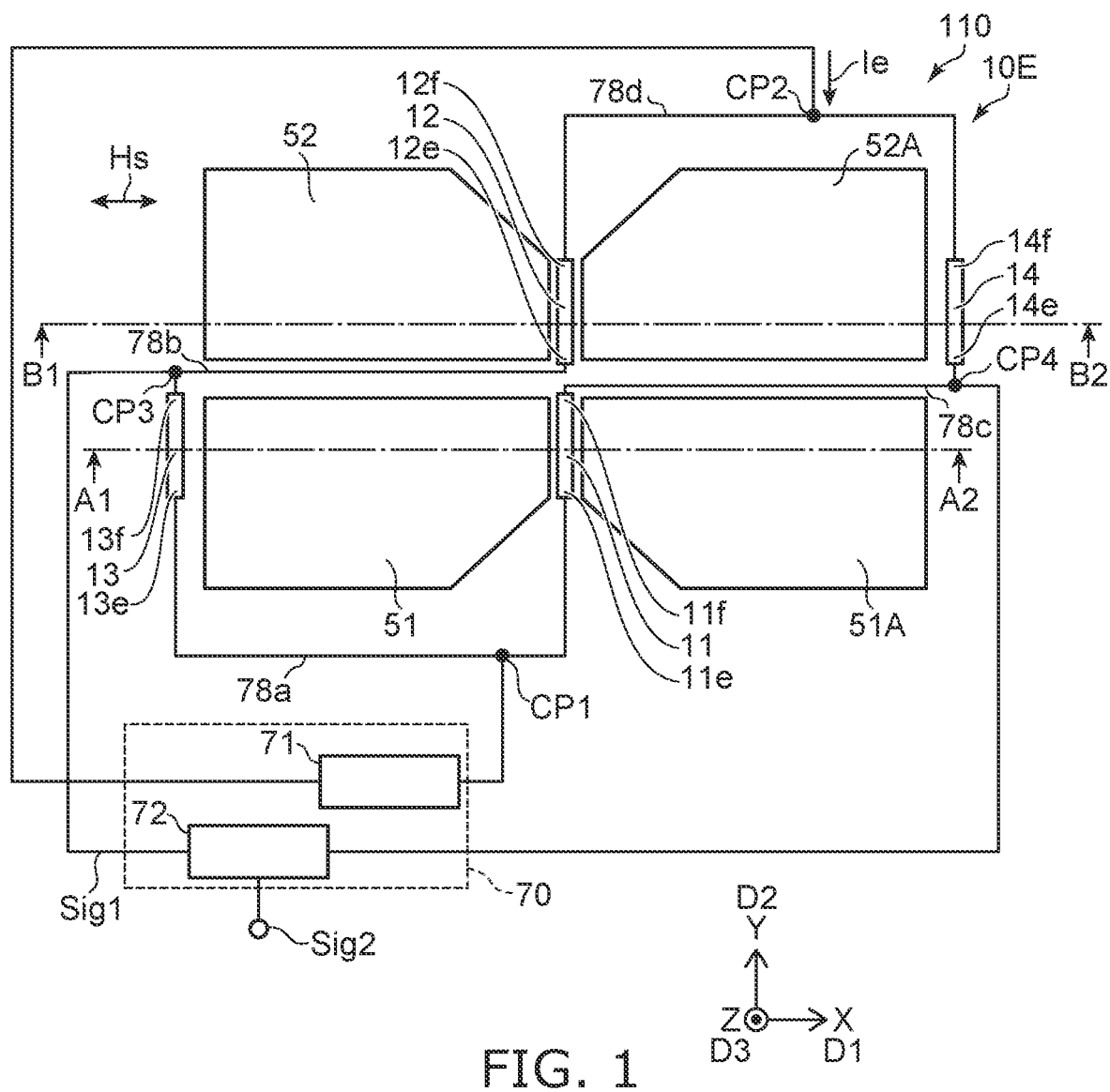
FIG. 1 is a schematic view illustrating a sensor according to a first embodiment.

According to one embodiment, a sensor includes an element portion. The element portion includes a first magnetic member, a first opposing magnetic member, a first element, a second magnetic member, a second opposing magnetic member, a second element, a third element, and a fourth element. The first opposing magnetic member is separated from the first magnetic member in a first direction from the first magnetic member to the first opposing magnetic member. The first element includes a first magnetic layer. A position of at least a part of the first element in the first direction is between a position of the first magnetic member in the first direction and a position of the first opposing magnetic member in the first direction. The first element includes a first portion and a first other portion. A second direction from the first portion to the first other portion crosses the first direction. A direction from the first magnetic member to the second magnetic member is along the second direction. The second opposing magnetic member is separated from the second magnetic member in the first direction. A direction from the first opposing magnetic member to the second opposing magnetic member is along the second direction. The second element includes a second magnetic layer. A position of at least a part of the second element in the first direction is between a position of the second magnetic member in the first direction and a position of the second opposing magnetic member in the first direction. The second element includes a second portion and a second other portion. A direction from the second portion to the second other portion is along the second direction. The third element includes a third portion and a third other portion. The third portion is electrically connected to the first portion. The third other portion is electrically connected to the second portion. The fourth element includes a fourth portion and a fourth other portion. The fourth portion is electrically connected to the first other portion. The fourth other portion is electrically connected to the second other portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 2A:
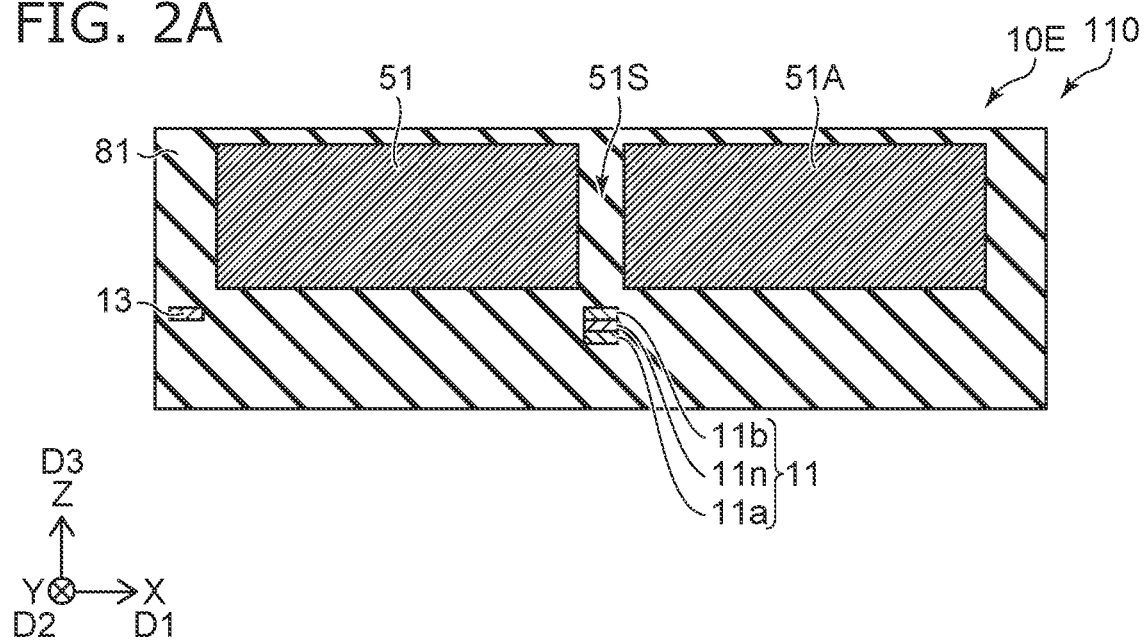
FIG. 2A and FIG. 2B are schematic views illustrating a sensor according to the first embodiment.
Figure 2B:
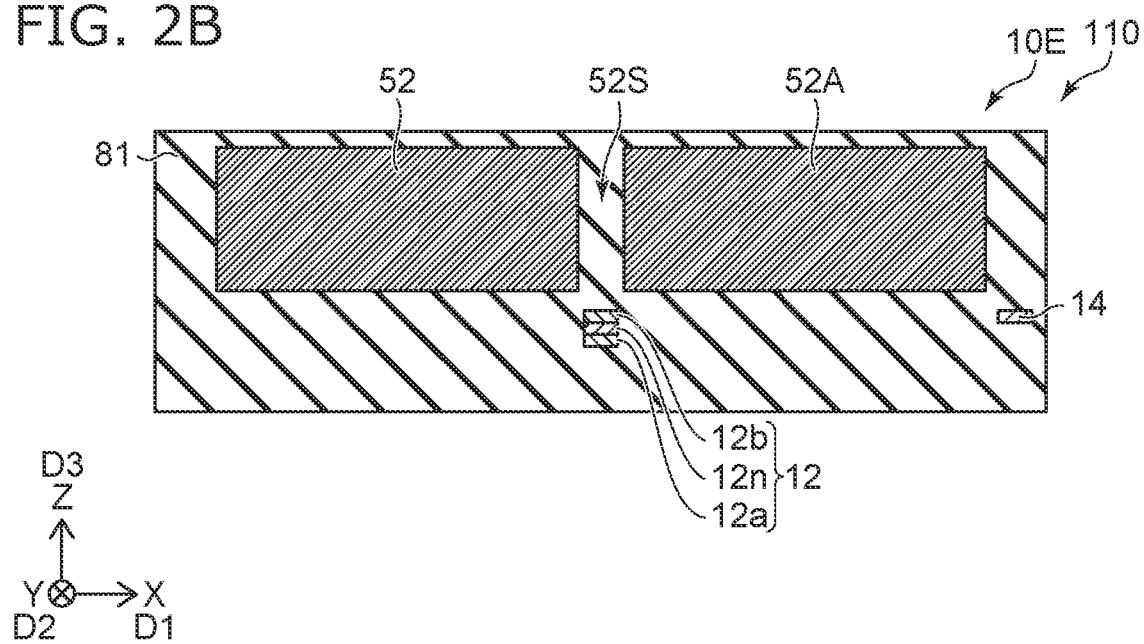

FIG. 1, FIG. 2A and FIG. 2B are schematic views illustrating a sensor according to a first embodiment.

FIG. 1 is a plan view. FIG. 2A is a cross-sectional view taken along the line A1-A2 of FIG. 1. FIG. 2B is a cross-sectional view taken along the line B1-B2 of FIG. 1.

As shown in FIG. 1, a sensor 110 according to the embodiment includes an element portion 10E. The element portion 10E includes a first magnetic member 51, a first opposing magnetic member 51A, a first element 11, a second magnetic member 52, a second opposing magnetic member 52A, a second element 12, a third element 13 and a fourth element 14.

The first opposing magnetic member 51A is separated from the first magnetic member 51 in a first direction D1. The first direction D1 is from the first magnetic member 51 to the first opposing magnetic member 51A.

The first direction D1 is an X-axis direction. One direction perpendicular to the X-axis direction is defined as a Y-axis direction. The direction perpendicular to the X-axis direction and the Y-axis direction is defined as a Z-axis direction. As shown in FIG. 2A, the first element 11 includes a first magnetic layer 11a and a first opposing magnetic layer 11b. The first element 11 is a magnetic element. The first element 11 may include a first non-magnetic layer 11n. The first non-magnetic layer 11n is provided between the first magnetic layer 11a and the first opposing magnetic layer 11b. The first non-magnetic layer 11n includes, for example, Cu. The first element 11 is, for example, a GMR (Giant Magnetoresistance effect) element.

A position of at least a part of the first element 11 in the first direction D1 is between a position of the first magnetic member 51 in the first direction D1 and a position of the first opposing magnetic member 51A in the first direction D1.

As shown in FIG. 2A, a region 51S exists between the first magnetic member 51 and the first opposing magnetic member 51A. At least a part of the first element 11 overlaps the region 51S in the Z-axis direction. As will be described later, a part of the first element 11 may overlap the first magnetic member 51 in the Z-axis direction. As will be described later, a part of the first element 11 may overlap the first opposing magnetic member 51A in the Z-axis direction.

As shown in FIG. 2A, an insulating member 81 may be provided between the first magnetic member 51, the first opposing magnetic member 51A, the first element 11, and the third element 13. The insulating member 81 may be provided in the region 51S.

As shown in FIG. 2A, in this example, the first element 11 is separated from the first magnetic member 51 and the first opposing magnetic member 51A in a third direction D3. The third direction D3 crosses a plane including the first direction D1 and a second direction D2.

As shown in FIG. 1, the first element 11 includes a first portion 11e and a first other portion 11f. The second direction D2 from the first portion 11d to the first other portion 11f crosses the first direction D1. The second direction D2 is, for example, the Y-axis direction.

The direction from the first magnetic member 51 to the second magnetic member 52 is along the second direction D2.

The second opposing magnetic member 52A is separated from the second magnetic member 52 in the first direction D1. The direction from the first opposing magnetic member 51A to the second opposing magnetic member 52A is along the second direction D2.

As shown in FIG. 2B, the second element 12 includes a second magnetic layer 12a and a second opposing magnetic layer 12b. The second element 12 is a magnetic element. The second element 12 may include a second non-magnetic layer 12n. The second non-magnetic layer 12n is provided between the second magnetic layer 12a and the second opposing magnetic layer 12b. The second non-magnetic layer 12n includes, for example, Cu. The second element 12 is, for example, a GMR element.

A position of at least a part of the second element 12 in the first direction D1 is between a position of the second magnetic member 52 in the first direction D1 and a position of the second opposing magnetic member 52A in the first direction D1.

As shown in FIG. 2B, a region 52S exists between the second magnetic member 52 and the second opposing magnetic member 52A. At least a part of the second element 12 overlaps the region 52S in the Z-axis direction. As will be described later, a part of the second element 12 may overlap the second magnetic member 52 in the Z-axis direction. As will be described later, a part of the second element 12 may overlap the second opposing magnetic member 52A in the Z-axis direction.

As shown in FIG. 2B, the insulating member 81 may be provided between the second magnetic member 52, the second opposing magnetic member 52A, the second element 12, and the fourth element 14. The insulating member 81 may be provided in the region 52S.

As shown in FIG. 2B, in this example, the second element 12 is separated from the second magnetic member 52 and the second opposing magnetic member 52A in the third direction D3.

The second element 12 includes a second portion 12e and a second other portion 12f. A direction from the second portion 12e to the second other portion 12f is along the second direction D2.

The third element 13 includes a third portion 13e and a third other portion 13f. The third portion 13e is electrically connected to the first portion 11e. The third other portion 13f is electrically connected to the second portion 12e. The third element 13 is, for example, a resistance element. The third element 13 may be a resistance element including a magnetic layer.

The fourth element 14 includes a fourth portion 14e and a fourth other portion 14f. The fourth portion 14e is electrically connected to the first other portion 11f. The fourth other portion 14f is electrically connected to the second other portion 12f. The fourth element 14 is, for example, a resistance element. The fourth element 14 may be a resistance element including a magnetic layer.

For example, the third portion 13e is electrically connected to the first portion 11e by a wiring 78a. The third other portion 13f is electrically connected to the second portion 12e by a wiring 78b. The fourth portion 14e is electrically connected to the first other portion 11f by a wiring 78c. The fourth other portion 14f is electrically connected to the second other portion 12f by a wiring 78d.

As described above, the element portion 10E includes four elements. The four elements are connected to form a bridge circuit. Bridge circuit allow for more accurate detection.

The detection target magnetic field Hs (see FIG. 1) is collected by the first magnetic member 51 and the first opposing magnetic member 51A. The collected detection target magnetic field Hr is efficiently applied to the first element 11. The detection target magnetic field Hr is collected by the second magnetic member 52 and the second opposing magnetic member 52A. The collected detection target magnetic field Hs is efficiently applied to the second element 12. The magnetic member and the opposing magnetic member function as an MFC (Magnetic Flux Concentrator).

The electrical resistance of the first element 11 and the electrical resistance of the second element 12 can be varied in accordance with the magnetic field (detection target magnetic field Hs) around the element portion 10E.

On the other hand, the magnetic field collected by the MFC is not substantially applied to the third element 13 and the fourth element 14. The electrical resistance of the third element 13 and the electrical resistance of the fourth element 14 do not substantially change even if the magnetic field (detection target magnetic field Hs) around the element portion 10E changes. The change of the electrical resistance of the third element 13 with respect to the detection target magnetic field Hs and the change of the electrical resistance of the fourth element 14 with respect to the detection target magnetic field Hs are smaller than the change of the electrical resistance of the first element 11 with respect to the detection target magnetic field Hs and smaller than the change of the electrical resistance of the second element 12 with respect to the detection target magnetic field Hs.

By the bridge circuit having such a configuration, a change in the electrical resistance of the first element 11 and a change in the electrical resistance of the second element 12 are detected. Thus, the detection target magnetic field Hs can be detected with high accuracy.

As shown in FIG. 1, an element current circuit 71 and a detection circuit 72 may be provided. For example, the element current circuit 71 and the detection circuit 72 may be included in the sensor 110.

The element current circuit 71 is configured to supply an element current Ie between a first connection point CP1 of the first portion 11e and the third portion 13e, and a second connection point CP2 of the second other portion 12f and the fourth other portion 14f.

The detection circuit 72 is configured to detect a detection signal Sig1 generated between a third connection point CP3 of the third other portion 13f and the second portion 12e, and a fourth connection point CP4 of the first other portion 11f and the fourth portion 14e.

The element current circuit 71 and the detection circuit 72 may be included in the controller 70, for example. An output signal Sig2 based on the detection signal Sig1 is output from the controller 70.

In the embodiment, the first element 11 and the second element 12 are provided at a diagonal position of the bridge circuit. The first element 11 and the second element 12 function as detection elements. The third element 13 and the fourth element 14 are provided at another diagonal position of the bridge circuit. The third element 13 and the fourth element 14 function as reference resistors.

In the embodiment, an MFC is provided in each of the first element 11 and the second element 12 functioning as a detection element. On the other hand, the MFC is not provided in the third element 13 and the fourth element 14 which function as reference resistors. Thereby, the element portion 10E is small in size. For example, detection with high spatial resolution is possible.

Figure 3:
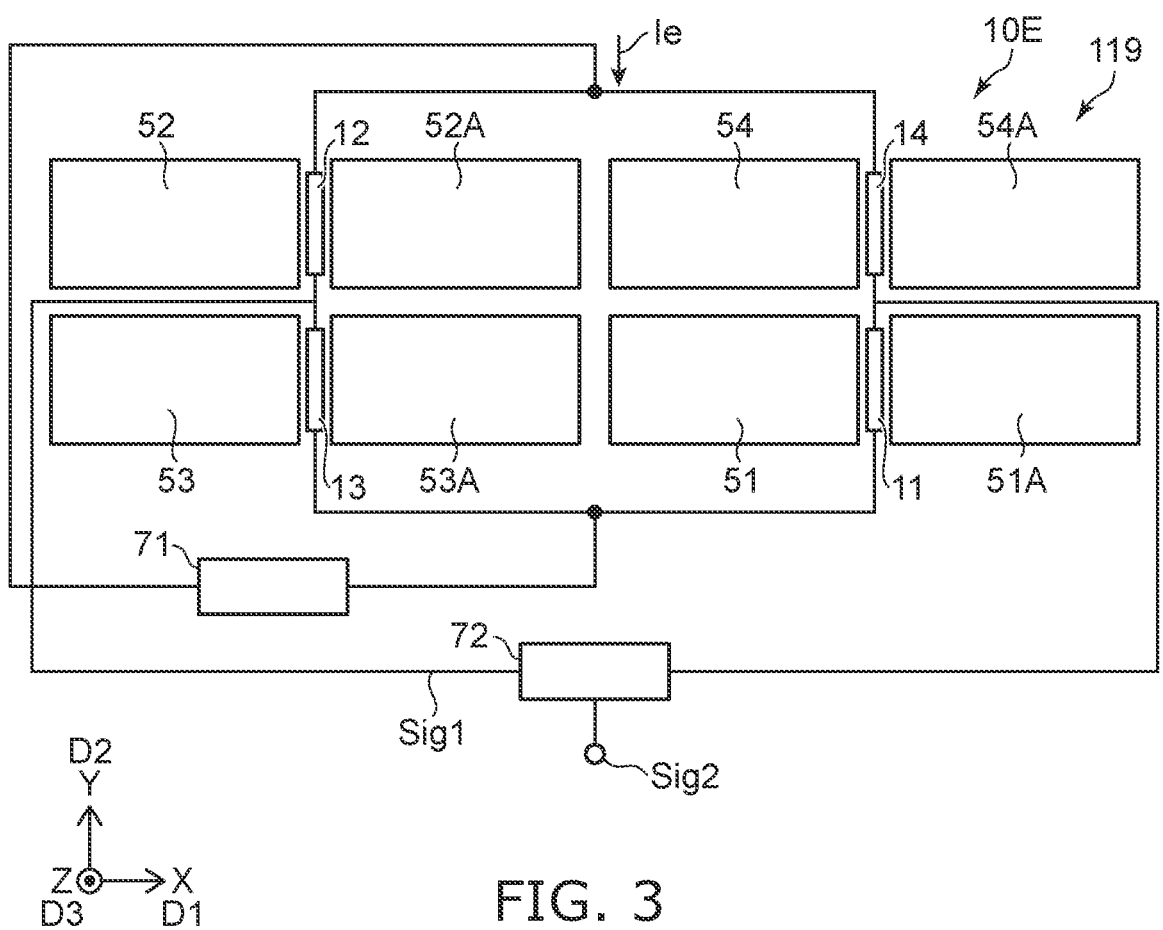
FIG. 3 is a schematic plan view illustrating a sensor according to a reference example.

FIG. 3 is a schematic plan view illustrating a sensor according to a reference example.

As shown in FIG. 3, a sensor 119 of the reference example includes first to fourth elements 11 to 14, first to fourth magnetic members 51 to 54, and first to fourth opposing magnetic members 51A to 54A. The first to fourth magnetic members 51 to 54 and the first to fourth opposing magnetic members 51A to 54A function as an MFC. The first element 11 overlaps a region between the first magnetic member 51 and the first opposing magnetic member 51A. The second element 12 overlaps a region between the second magnetic member 52 and the second opposing magnetic member 52A. The third element 13 overlaps a region between the third magnetic member 53 and the third opposing magnetic member 53A. The fourth element 14 overlaps a region between the fourth magnetic member 54 and the fourth opposing magnetic member 54A. The first to fourth elements 11 to 14 are connected to form a bridge circuit.

In the sensor 119, the electrical resistance of each of the first to fourth elements 11 to 14 changes in accordance with the target magnetic field Hs. In the sensor 119, a high output signal is obtained. However, in the sensor 119, the first element 11 and the second element 12 are provided at the diagonal of the bridge circuit. The third element 13 and the fourth element 14 are provided at a diagonal of the bridge circuit. In the sensor 119, the distance between the first element 11 and the second element 12 along the first direction D1 (for example, the X-axis direction) is long. It is difficult to obtain a high spatial resolution in the sensor 119.

On the other hand, in the sensor 110 according to the embodiment, the MFC is omitted for the third element 13 and the fourth element 14. Thus, the distance between the first element 11 and the second element 12 along the first direction D1 can be shortened. In the sensor 110, a spatial resolution higher than that of the sensor 119 can be obtained.

In the sensor 110, the electrical resistance of the third element 13 and the electrical resistance of the fourth element 14 do not substantially change with respect to the magnetic field to be detected (Hs). Therefore, the output signal of the sensor 110 is lower than the output signal of the sensor 119. However, the spatial resolution of the detection in the sensor 110 is higher than the spatial resolution of the detection in the sensor 119. For example, the target magnetic field Hs can be detected with high positional accuracy. According to an embodiment, a sensor with improved capability can be provided.

Figure 4:
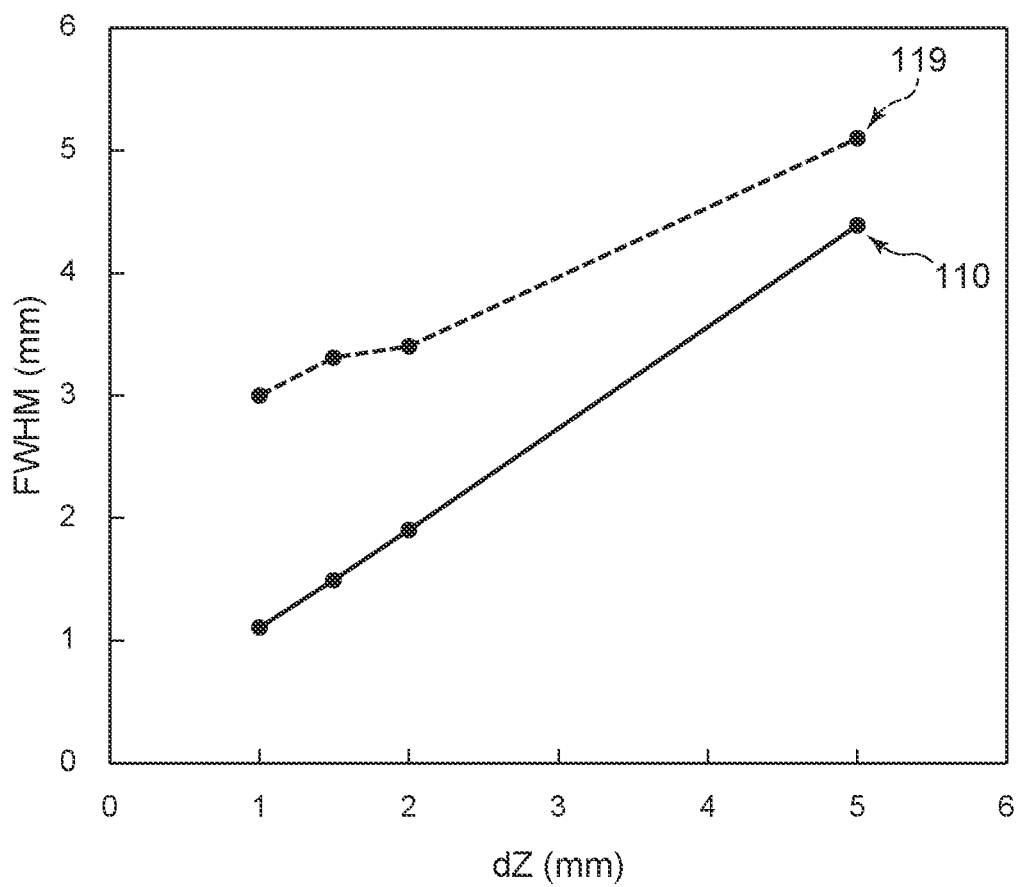
FIG. 4 is a graph illustrating characteristics of the sensor.

FIG. 4 is a graph illustrating characteristics of the sensor.

The horizontal axis of FIG. 4 is the distance dZ between the element portion 10E and the target object which generates the target magnetic field Hs. The vertical axis is a parameter FWHM (Full Width at Half Maximum). FWHM is the full width at half maximum of the peak value in the sensitivity distribution function in the X-axis direction calculated by the finite element method. A small FWHM corresponds to a high spatial resolution. FIG. 4 illustrates the characteristics of the sensor 110 and the characteristics of the sensor 119.

As shown in FIG. 4, the sensor 110 provides a smaller FWHM than the sensor 119 does. In particular, the difference in this characteristic is remarkable when the distance dZ is short. According to the embodiments, detection with high spatial resolution is possible.

For example, as illustrated in FIG. 1, in the sensor 110, the direction from the first element 11 to the second element 12 is along the second direction D2. Higher spatial resolution is easily obtained.

Figure 5A:
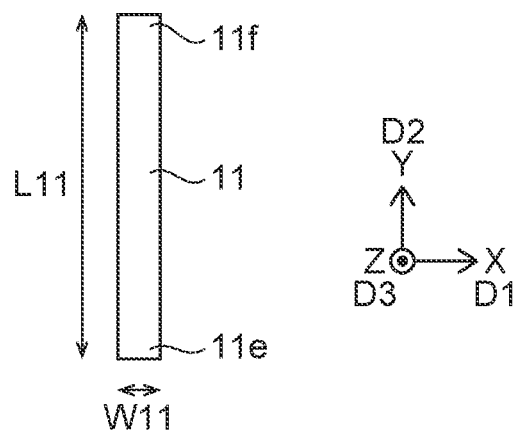
FIGS. 5A and 5B are schematic plan views illustrating a part of the sensor according to the first embodiment.
Figure 5B:
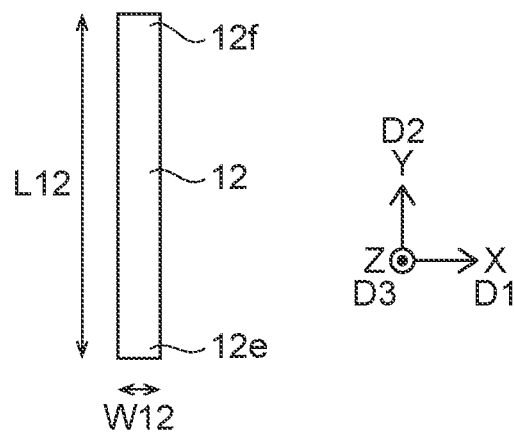

FIGS. 5A and 5B are schematic plan views illustrating a part of the sensor according to the first embodiment.

As shown in FIG. 5A, for example, a length L11 of the first element 11 along the second direction D2 is longer than a length W11 of the first element 11 along the first direction D1. With such a shape, the magnetization of the first magnetic layer 11a and the magnetization of the first opposing magnetic layer 11b become more stable. As shown in FIG. 5B, a length L12 of the second element 12 along the second direction D2 is longer than the length W12 of the second element 12 along the first direction D1. With such a shape, the magnetization of the second magnetic layer 12a and the magnetization of the second opposing magnetic layer 12b become more stable.

One of the first magnetic layer 11a and the first opposing magnetic layer 11b is a magnetization free layer. The other of the first magnetic layer 11a and the first opposing magnetic layer 11b is a magnetization reference layer. One of the second magnetic layer 12a and the second opposing magnetic layer 12b is a magnetization free layer. The other of the second magnetic layer 12a and the second opposing magnetic layer 12b is a magnetization reference layer.

The first magnetic layer 11a, the first opposing magnetic layer 11b, the second magnetic layer 12a, and the second opposing magnetic layer 12b include, for example, at least one selected from the group consisting of Fe, Co, and Ni.

Figure 6:
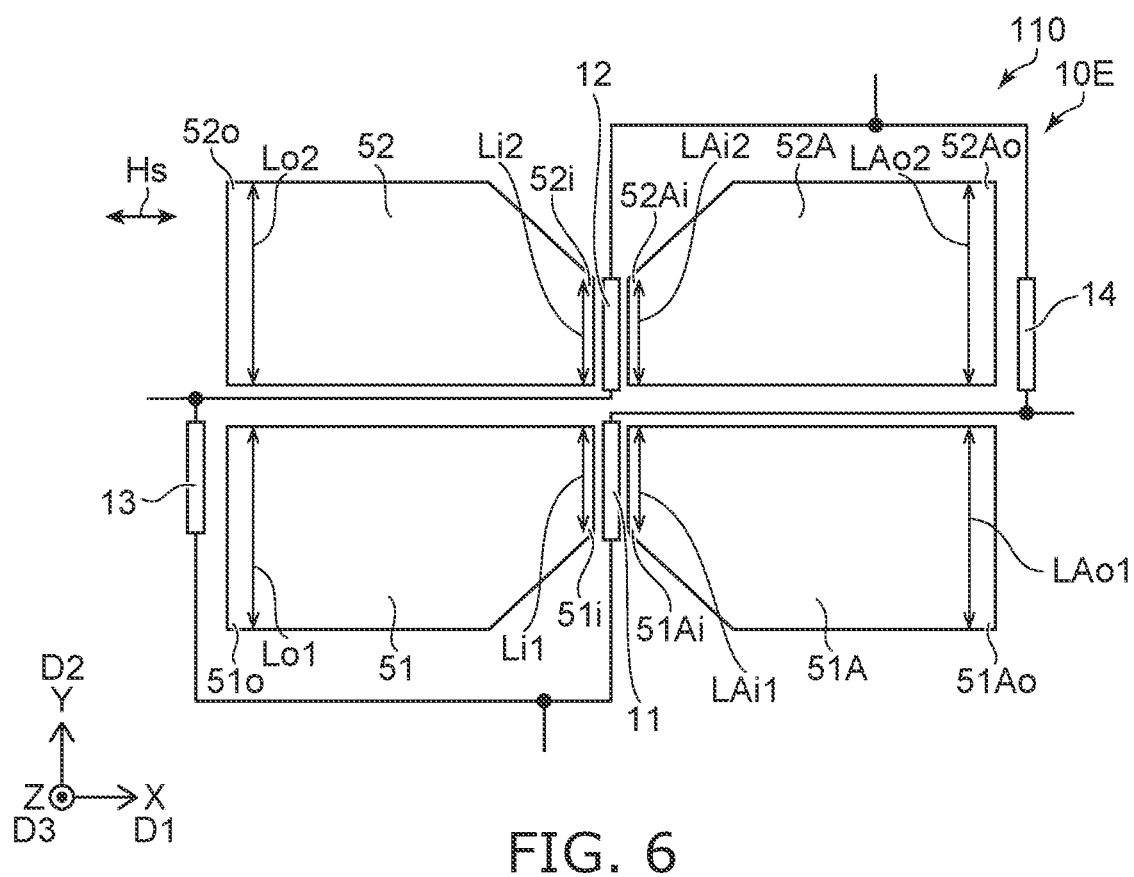
FIG. 6 is a schematic plan view illustrating the sensor according to the first embodiment.

FIG. 6 is a schematic plan view illustrating the sensor according to the first embodiment.

As shown in FIG. 6, in the sensor 110, the first magnetic member 51 includes a first outer portion 51O and a first inner portion 51i. The first opposing magnetic member 51A includes a first opposing inner portion 51Ai and a first opposing outer portion 51Ao. The first inner portion 51i is located between the first outer portion 51O and the first opposing inner portion 51Ai. The first opposing inner portion 51Ai is located between the first inner portion 51i and the first opposing outer portion 51Ao.

In this example, a length Li1 of the first inner portion 51i along the second direction D2 is shorter than a length Lo1 of the first outer portion 51O along the second direction D2. A length LAi1 of the first opposing inner portion 51Ai along the second direction D2 is shorter than a length LAo1 of the first opposing outer portion 51Ao along the second direction D2.

The second magnetic member 52 includes a second outer portion 52O and a second inner portion 52i. The second opposing magnetic member 52A includes a second opposing inner portion 52Ai and a second opposing outer portion 52Ao. The second inner portion 52i is located between the second outer portion 52O and the second opposing inner portion 52Ai. The second opposing inner portion 52Ai is located between the second inner portion 52i and the second opposing outer portion 52Ao.

A length Li2 of the second inner portion 52i along the second direction D2 is shorter than a length Lo2 of the second outer portion 52O along the second direction D2. A length LAi2 of the second opposing inner portion 52Ai along the second direction D2 is shorter than a length LAo2 of the second opposing outer portion 52Ao along the second direction D2.

By setting the length of the inner portion (length Li1, length LAi1, length Li2 and length LAi2) shorter than the length of the outer portion, the target magnetic field Hs is more effectively concentrated and applied to the first element 11 and the second element 12. Higher sensitivity is obtained.

For example, the first outer portion 51O may be the outer edge of the first magnetic member 51. The first inner portion 51i may be the inner end portion of the first magnetic member 51. The first opposing outer portion 51Ao may be the outer edge of the first opposing magnetic member 51A. The first opposing inner portion 51Ai may be the inner end portion of the first opposing magnetic member 51A.

For example, the second outer portion 52O may be the outer edge of the second magnetic member 52. The second inner portion 52i may be the inner end of the second magnetic member 52. The second opposing outer portion 52Ao may be the outer edge of the second opposing magnetic member 52A. The second opposing inner portion 52Ai may be the inner end portion of the second opposing magnetic member 52A.

In an embodiment, the length of the inner portion (length Li1, length LAi1, length Li2 and length LAi2) may be substantially the same as the length of the outer portion (length Lo1, length LAo1, length Lo2 and length LAo2). It is easy to manufacture in this case. Low cost manufacturing is possible.

As shown in FIG. 6, in the sensor 110, at least one of the position of the first magnetic member 51 in the first direction D1 or the position of the first opposing magnetic member 51A in the first direction D1 is located between the position of the third element 13 in the first direction D1 and the position of the fourth element 14 in the first direction D1.

As shown in FIG. 6, at least one of the position of the second magnetic member 52 in the first direction D1 or the position of the second opposing magnetic member 52A in the first direction D1 is located between the position of the third element 13 in the first direction D1 and the position of the fourth element 14 in the first direction D1.

As will be described later, the positions of the third element 13 and the fourth element 14 can be modified in various ways.

Several examples of the element portion 10E will be described below.

Figure 7A:
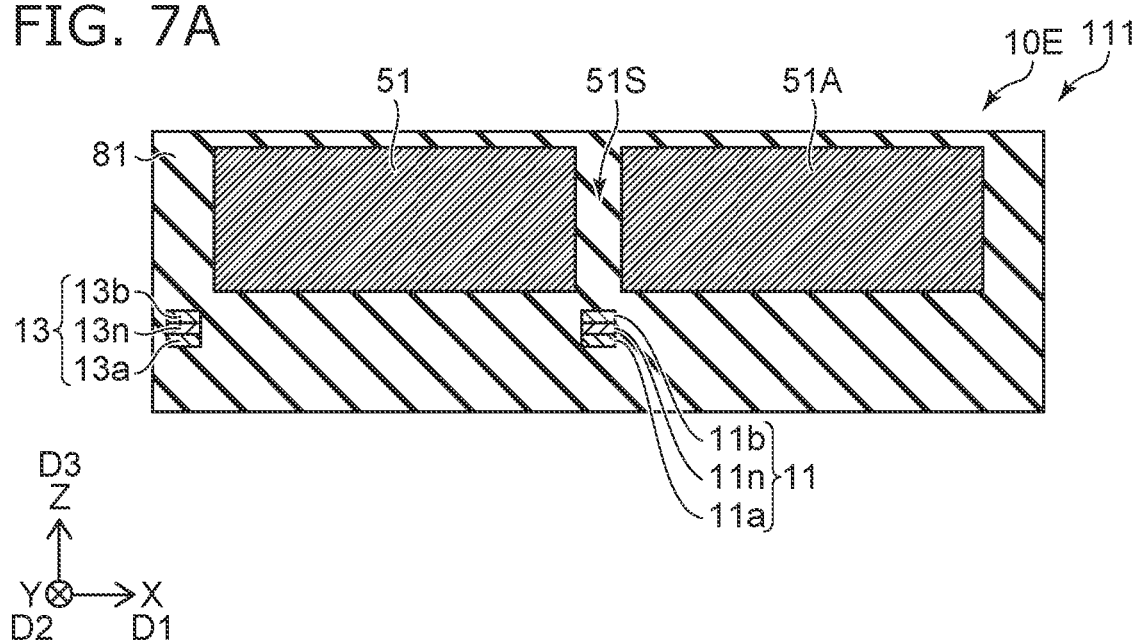
FIGS. 7A and 7B are schematic cross-sectional views illustrating a sensor according to the first embodiment.
Figure 7B:
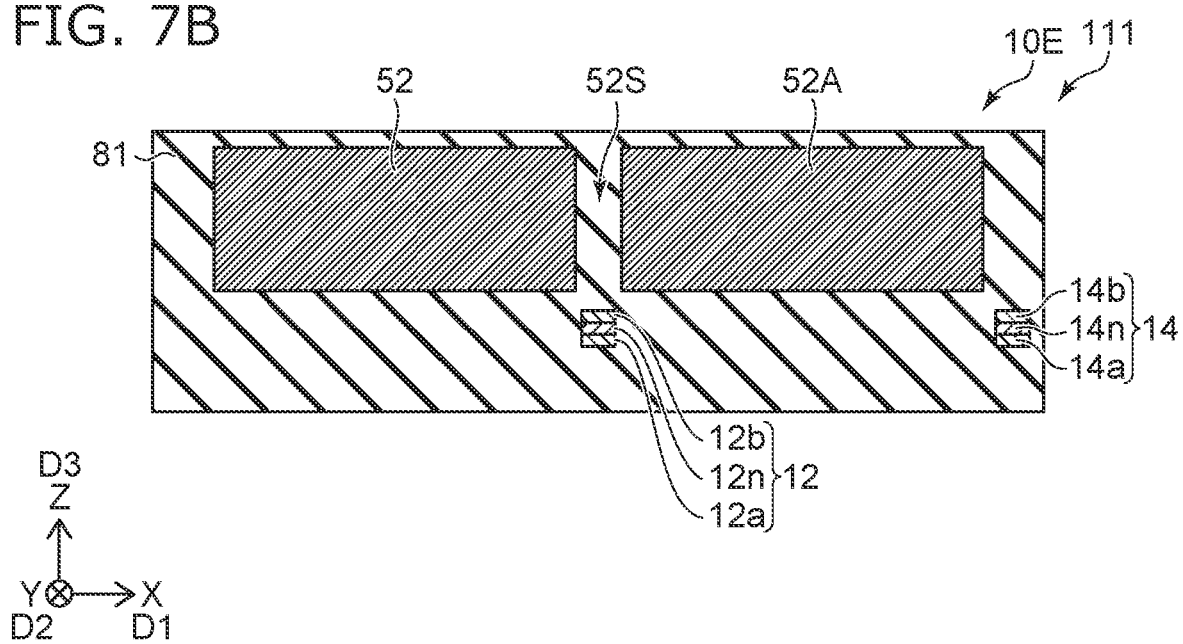

FIGS. 7A and 7B are schematic cross-sectional views illustrating a sensor according to the first embodiment.

As shown in FIG. 7A, in a sensor 111 according to the embodiment, the third element 13 includes a third magnetic layer 13a and a third opposing magnetic layer 13b. The third element 13 may include a third non-magnetic layer 13n provided between the third magnetic layer 13a and the third opposing magnetic layer 13b.

As shown in FIG. 7B, the fourth element 14 includes a fourth magnetic layer 14a and a fourth opposing magnetic layer 14b. The fourth element 14 may include a fourth non-magnetic layer 14n provided between the fourth magnetic layer 14a and the fourth opposing magnetic layer 14b.

The third element 13 and the fourth element 14 are, for example, GMR elements. The third element 13 includes, for example, the same material as the material included in the first element 11. The fourth element 14 includes, for example, the same material as that included in the second element 12. This configuration of elements can be obtained by simple fabrication process. The configuration of the sensor 111 excluding the above may be the same as the configuration of the sensor 110.

A direction from the first magnetic layer 11a to the first opposing magnetic layer 11b is along the third direction D3. As already explained, the third direction D3 crosses a plane including the first direction D1 and the second direction D2. A direction from the second magnetic layer 12a to the second opposing magnetic layer 12b is along the third direction D3.

Figure 8A:
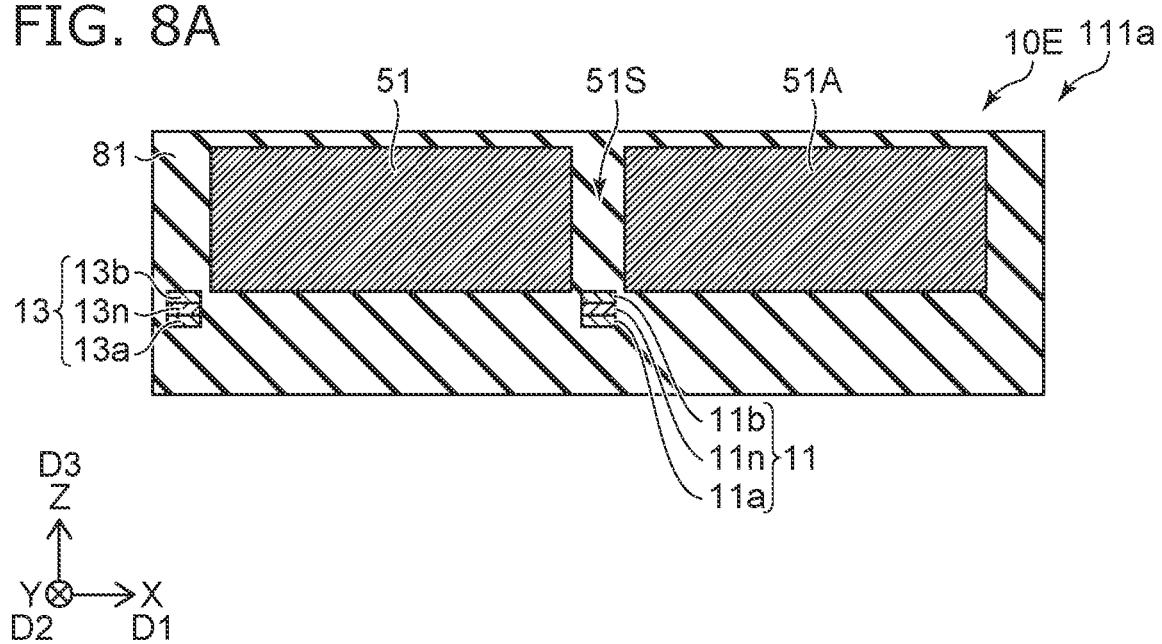
FIGS. 8A and 8B are schematic cross-sectional views illustrating the sensor according to the first embodiment.
Figure 8B:
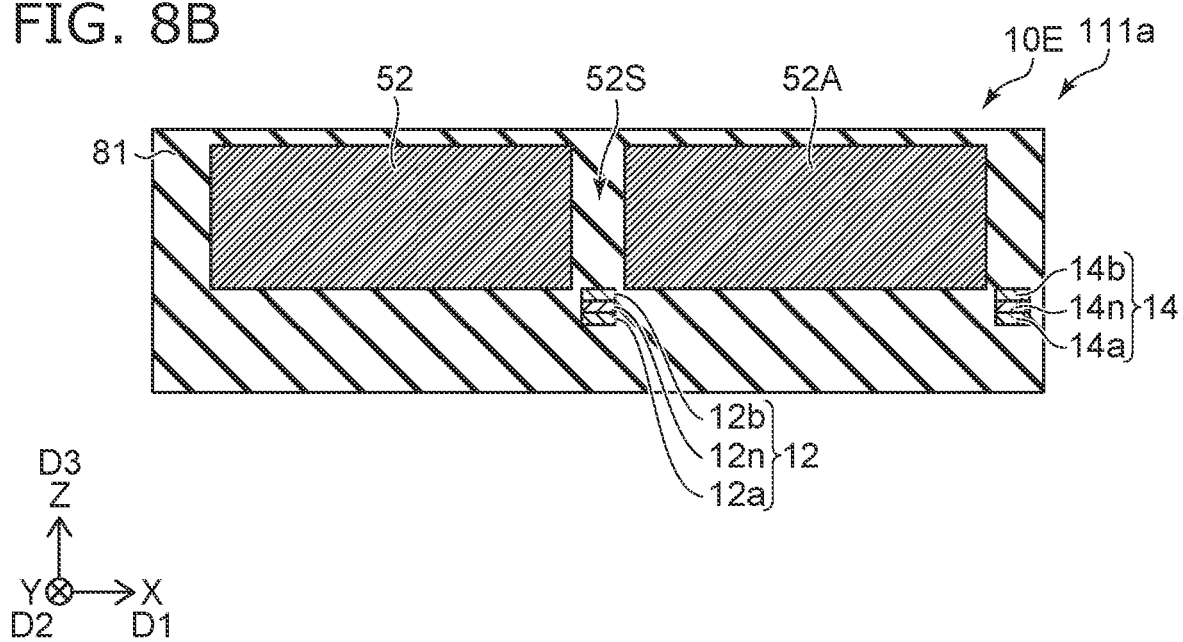

FIGS. 8A and 8B are schematic cross-sectional views illustrating the sensor according to the first embodiment.

As shown in FIG. 8A, in a sensor 111a according to the embodiment, the first element 11 overlaps at least one of the first magnetic member 51 or the first opposing magnetic member 51A in the first direction D1. The third element 13 may overlap at least one of the first magnetic member 51 or the first opposing magnetic member 51A in the first direction D1.

As shown in FIG. 8B, the second element 12 overlaps at least one of the second magnetic member 52 or the second opposing magnetic member 52A in the first direction D1. The fourth element 14 may overlap at least one of the second magnetic member 52 or the second opposing magnetic member 52A in the first direction D1. Except for the above, the configuration of the sensor 111a may be the same as the configuration of the sensor 110 or the sensor 111.

Figure 9A:
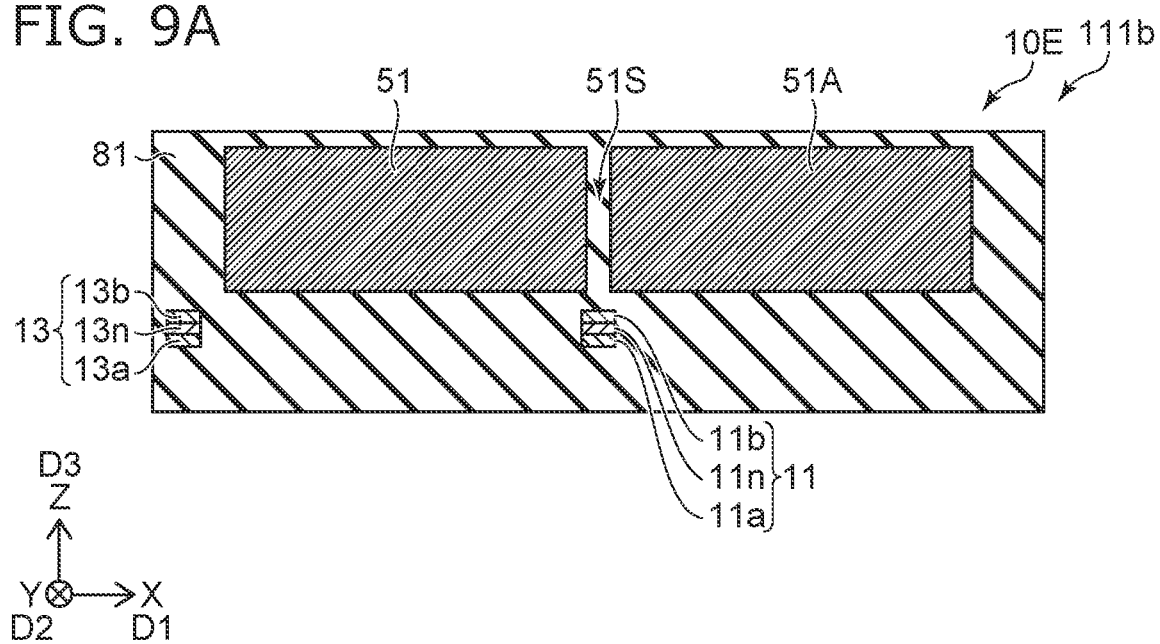
FIGS. 9A and 9B are schematic cross-sectional views illustrating the sensor according to the first embodiment.
Figure 9B:
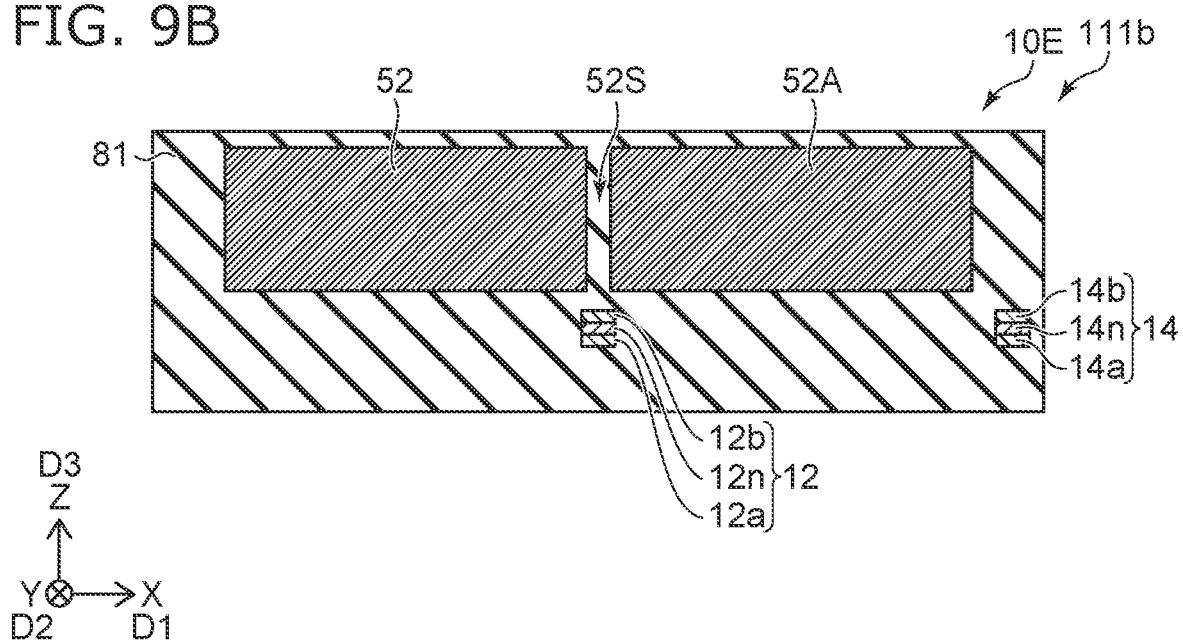

FIGS. 9A and 9B are schematic cross-sectional views illustrating the sensor according to the first embodiment.

As shown in FIG. 9A, in a sensor 111b according to the embodiment, a part of the first element 11 overlaps at least one of the first magnetic member 51 or the first opposing magnetic member 51A in the third direction D3. As already explained, the third direction D3 crosses a plane including the first direction D1 and the second direction D2.

As shown in FIG. 9B, a part of the second element 12 overlaps at least one of the second magnetic member 52 and the second opposing magnetic member 52A in the third direction D3. Except for the above, the configuration of the sensor 111b may be the same as the configuration of the sensor 110 or the sensor 111.

Figure 10A:
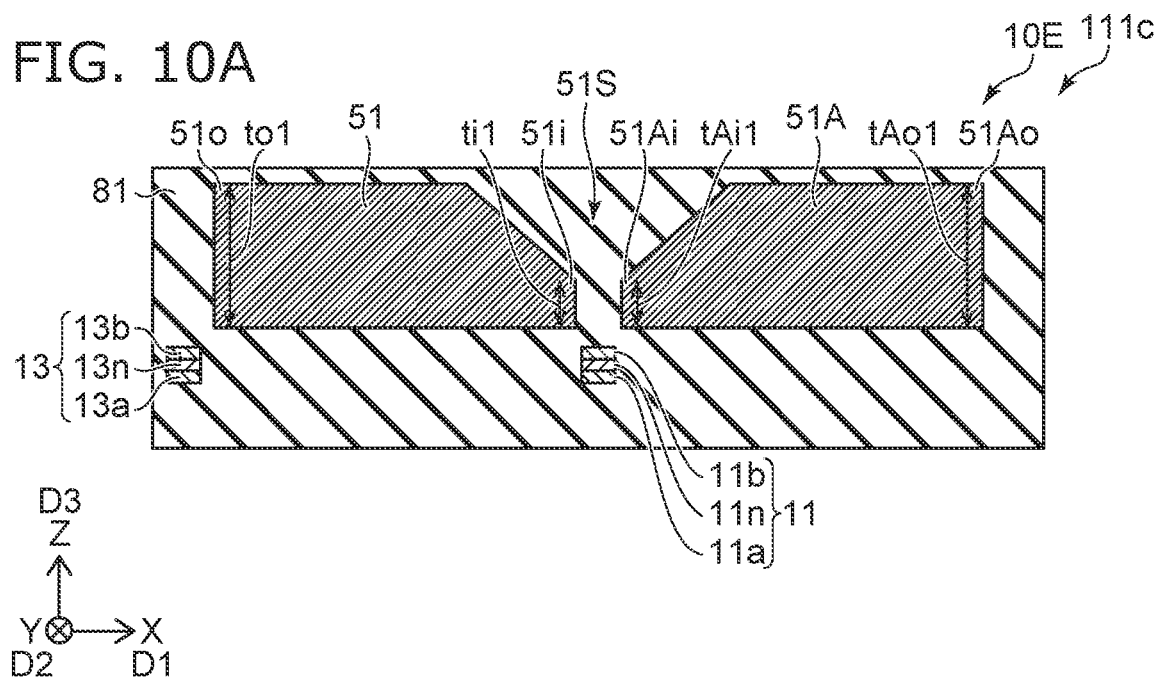
FIGS. 10A and 10B are schematic cross-sectional views illustrating the sensor according to the first embodiment.
Figure 10B:
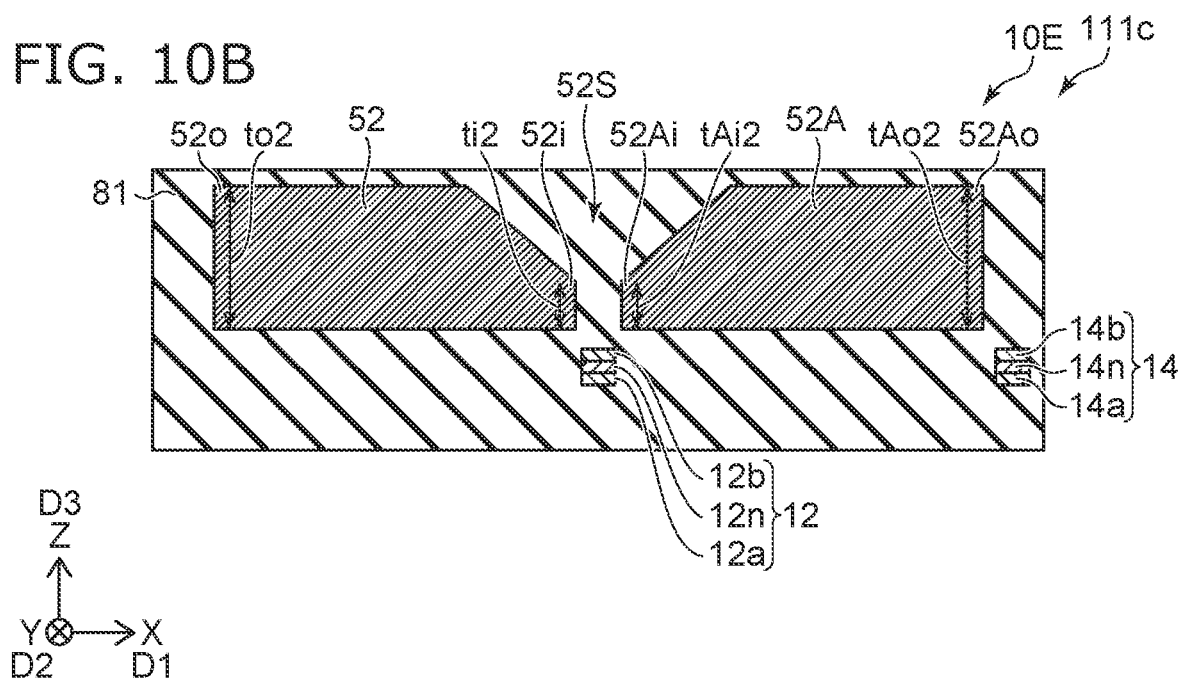

FIGS. 10A and 10B are schematic cross-sectional views illustrating the sensor according to the first embodiment.

As shown in FIGS. 10A and 10B, in a sensor 111c according to the embodiment, the thickness of the magnetic member in the Z-axis direction changes. Except for this, the configuration of the sensor 111c may be the same as the configuration of the sensor 110, the sensor 111, the sensor 111a, or the sensor 111b.

As shown in FIG. 10A, in the sensor 111c, in the first magnetic member 51, a length ti1 of the first inner portion 51i along the third direction D3 is shorter than a length to1 of the first outer portion 51O along the third direction D3. A length tAi1 of the first opposing inner portion 51Ai along the third direction D3 is shorter than a length tAo1 of the first opposing outer portion 51Ao along the third direction D3.

As shown in FIG. 10B, a length ti2 of the second inner portion 52i along the third direction D3 is shorter than a length to2 of the second outer portion 52O along the third direction D3. A length tAi2 of the second opposing inner portion 52Ai along the third direction D3 is shorter than a length tAo2 of the second opposing outer portion 52Ao along the third direction D3.

By setting the inner thickness (the length along the third direction D3) shorter than the outer thickness, the target magnetic field Hs is more effectively concentrated and applied to the first element 11 and the second element 12. Higher sensitivity is obtained.

Figure 11:
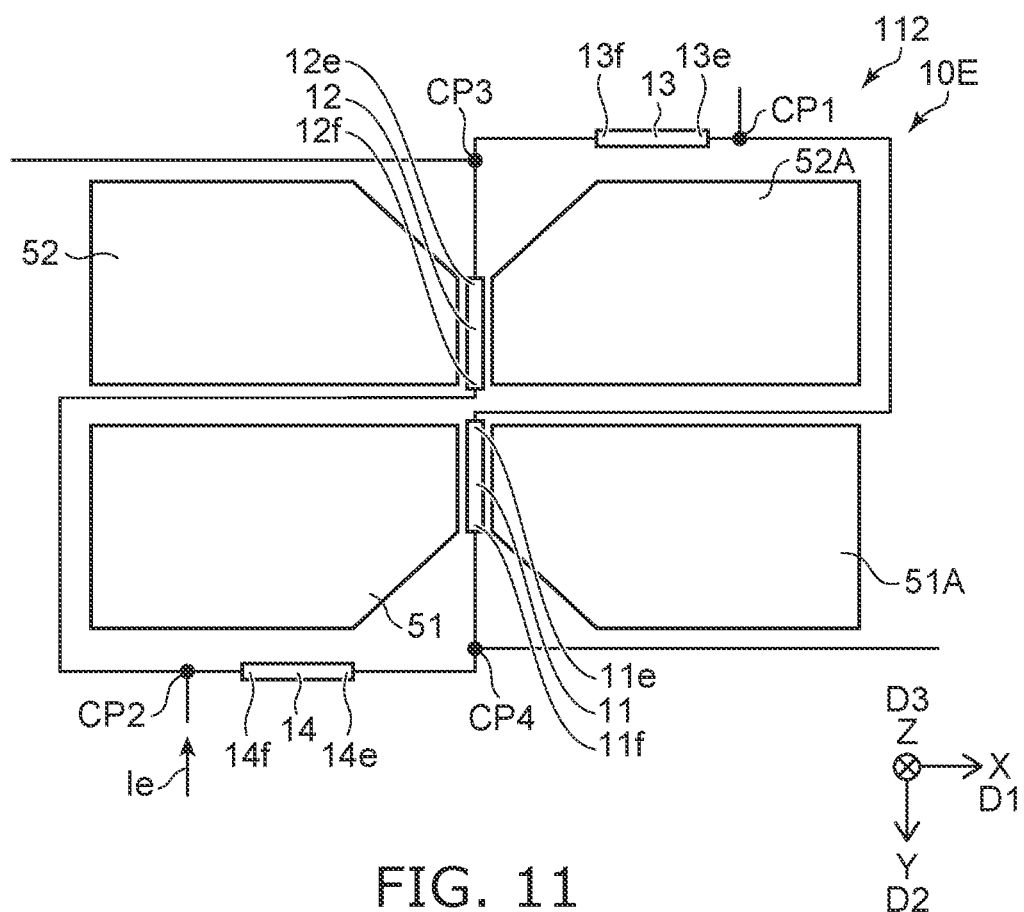
FIG. 11 is a schematic plan view illustrating a sensor according to the first embodiment.

FIG. 11 is a schematic plan view illustrating a sensor according to the first embodiment.

As shown in FIG. 11, in a sensor 112 according to the embodiment, the positions of the third element 13 and the fourth element 14 are different from the positions of the third element 13 and the fourth element 14 in the sensor 110. The configuration of the sensor 112 other than this may be the same as that of the sensor 110, the sensor 111, or the sensors 111a to 111c.

In the sensor 112, the position of the first magnetic member 51 in the second direction D2 and the position of the second magnetic member 52 in the second direction D2 are located between the position of the third element 13 in the second direction D2 and the position of the fourth element 14 in the second direction D2.

Figure 12:
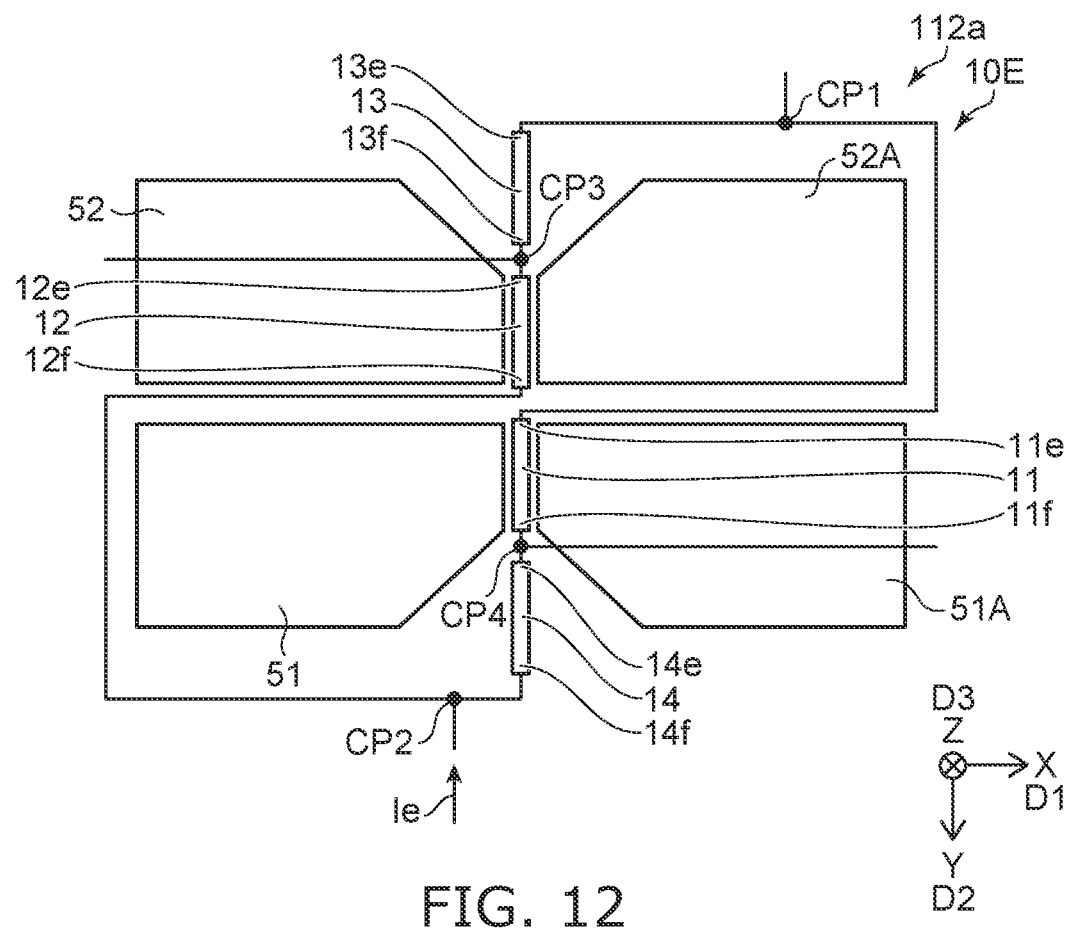
FIG. 12 is a schematic plan view illustrating a sensor according to the first embodiment.

FIG. 12 is a schematic plan view illustrating a sensor according to the first embodiment.

As shown in FIG. 12, in a sensor 112a according to the embodiment, the positions of the third element 13 and the fourth element 14 are different from the positions of the third element 13 and the fourth element 14 in the sensor 110. The configuration of the sensor 112a may be the same as that of the sensor 110, the sensor 111, or the sensors 111a to 111c.

In the sensor 112a, the direction from the first element 11 to the second element 12 is along the second direction D2. The direction from the third element 13 to the first element 11 is along the second direction D2. The direction from the second element 12 to the fourth element 14 is along the second direction D2.

Figure 13:
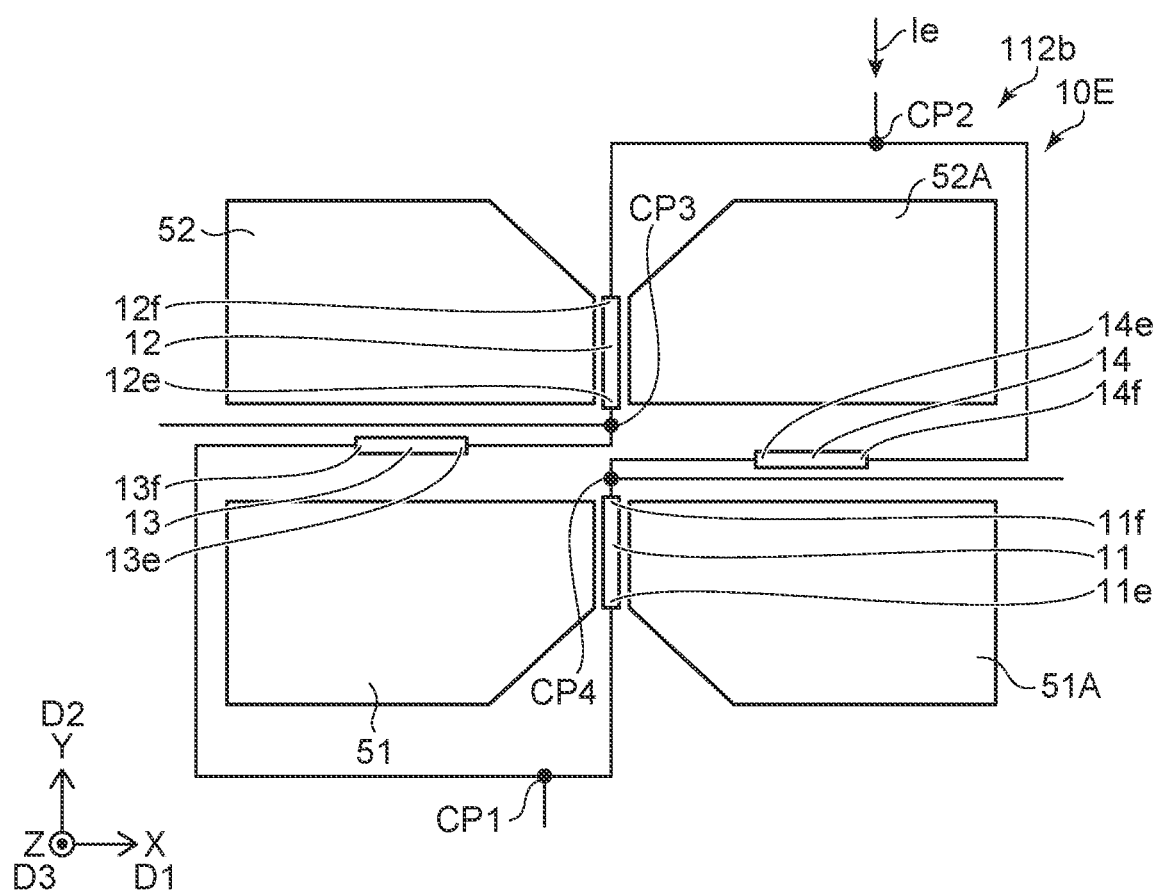
FIG. 13 is a schematic plan view illustrating a sensor according to the first embodiment.

FIG. 13 is a schematic plan view illustrating a sensor according to the first embodiment.

As shown in FIG. 13, in a sensor 112b according to the embodiment, the positions of the third element 13 and the fourth element 14 are different from the positions of the third element 13 and the fourth element 14 in the sensor 110. The configuration of the sensor 112b except this may be the same as that of the sensor 110, the sensor 111, or the sensors 111a to 111c.

In the sensor 112b, at least one of the position of the third element 13 in the second direction D2 or the position of the fourth element 14 in the second direction D2 is located between the position of the first magnetic member 51 in the second direction D2 and the position of the second magnetic member 52 in the second direction D2.

In the sensors 110, 111, 111a to 111c, 112, and 112b, at least one of the positions of at least a part of the first element 11 in the first direction D1 and at least a part of the position of at least a part of the second element 12 in the first direction D1 is located between the position of the third element 13 in the first direction D1 and the position of the fourth element 14 in the first direction D1.

In the sensors 110, 111, 111a to 111c, 112, 112a, and 112b, the third element 13 and the fourth element 14 do not overlap the first magnetic member 51, the first opposing magnetic member 51A, the second magnetic member 52, and the second opposing magnetic member 52A in the third direction D3.

Figure 14:
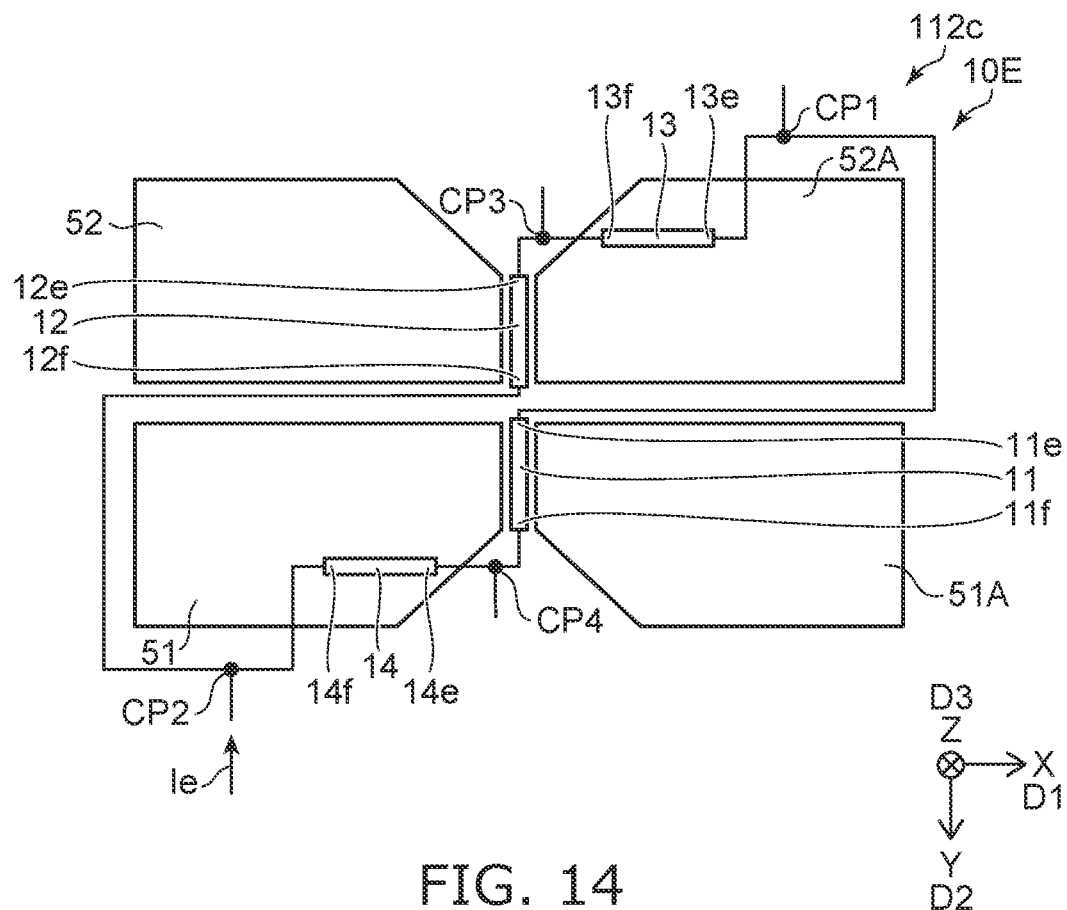
FIG. 14 is a schematic plan view illustrating a sensor according to the first embodiment.

FIG. 14 is a schematic plan view illustrating a sensor according to the first embodiment.

As shown in FIG. 14, in a sensor 112c according to the embodiment, the positions of the third element 13 and the fourth element 14 are different from the positions of the third element 13 and the fourth element 14 in the sensor 110. Except for this, the configuration of the sensor 112c may be the same as the configuration of the sensor 110, the sensor 111, or the sensors 111a to 111c.

In the sensor 112c, the third element 13 overlaps the second opposing magnetic member 52A in the third direction D3. The fourth element 14 overlaps the first magnetic member 51 in the third direction D3. For example, it is easy to obtain a small element portion 10E.

In the embodiment, at least one of the third element 13 or the fourth element 14 may overlap at least one of the first magnetic member 51, the first opposing magnetic member 51A, the second magnetic member 52 or the second opposing magnetic member 52A in the third direction D3.

The sensor 111, sensors 111a to 111c, sensor 112, and sensors 112a to 112c also provide high spatial resolution. A sensor whose characteristics can be improved can be provided.

Figure 15:
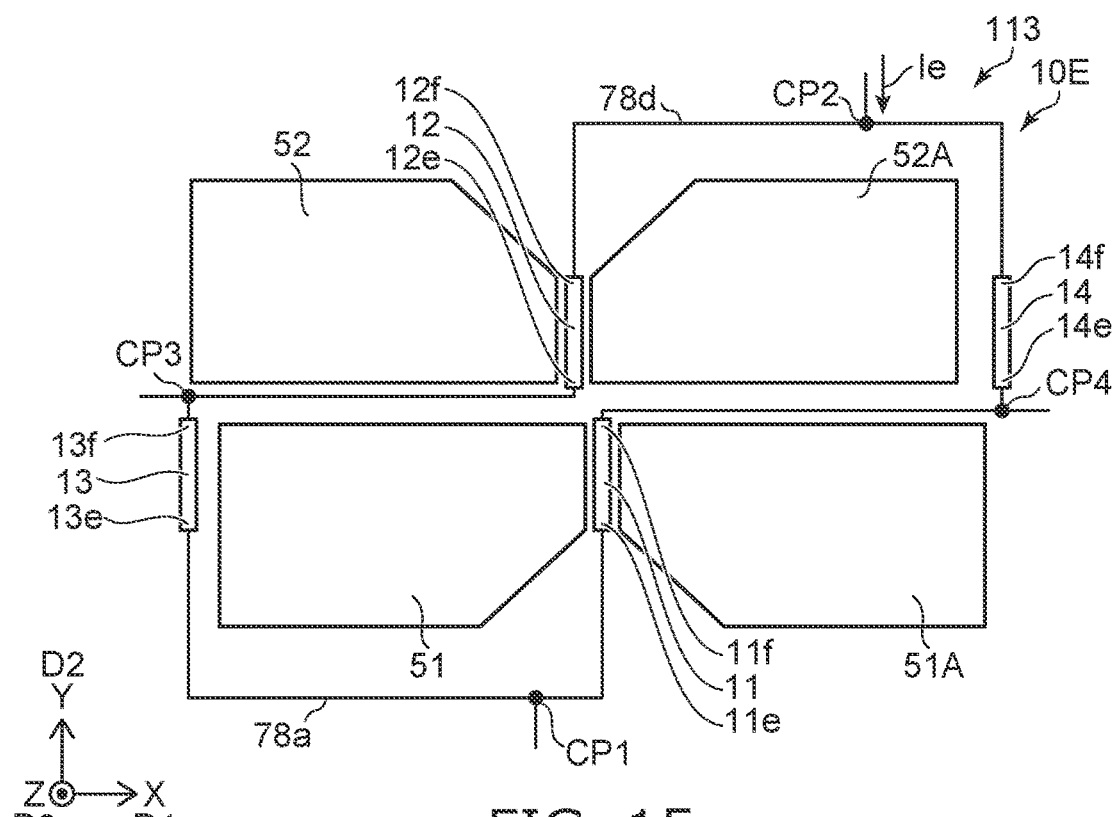
FIG. 15 is a schematic plan view illustrating a sensor according to the first embodiment.

FIG. 15 is a schematic plan view illustrating a sensor according to the first embodiment.

As shown in FIG. 15, in a sensor 113 according to the embodiment, the position of the second element 12 in the first direction D1 is different from the position of the first element 11 in the first direction D1. The second element 12 may be shifted from the first element 11. Except for this, the configuration of the sensor 113 may be the same as the configuration of the sensor 110, the sensor 111, the sensors 111a to 111c, the sensor 112, and the sensors 112a to 112c.

In the sensor 113, a distance (shift amount) along the first direction D1 between the position of the first element 11 in the first direction D1 and the position of the second element 12 in the first direction D1 is 0.3 times or less of a length of the first magnetic member 51 in the first direction D1.

Figure 16:
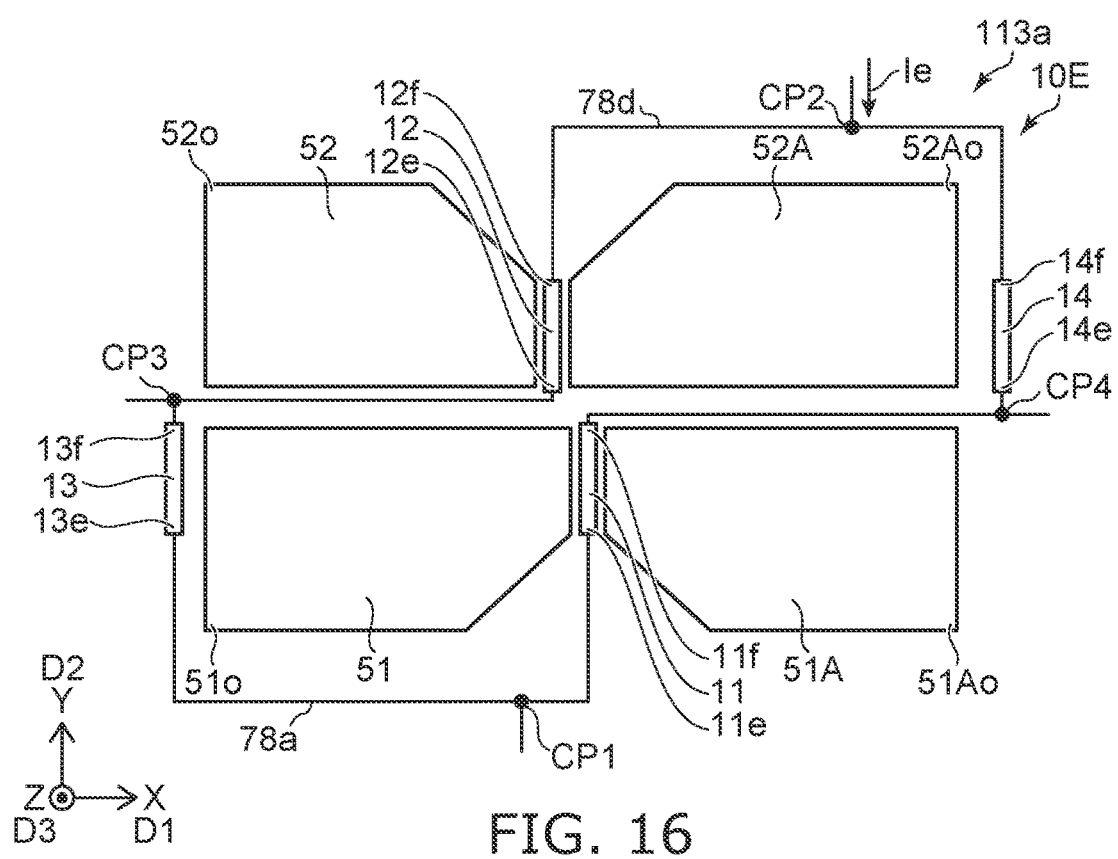
FIG. 16 is a schematic plan view illustrating a sensor according to the first embodiment.

FIG. 16 is a schematic plan view illustrating a sensor according to the first embodiment.

As shown in FIG. 16, also in a sensor 113a according to the embodiment, the position of the second element 12 in the first direction D1 is different from the position of the first element 11 in the first direction D1. In the sensor 113a, the position of the first outer portion 510 in the first direction D1 may be substantially the same as the position of the second outer portion 520 in the first direction D1. The position of the first opposing outer portion 51Ao in the first direction D1 may be substantially the same as the position of the second opposing outer portion 52Ao in the first direction D1. Except for this, the configuration of the sensor 113a may be the same as the configuration of the sensor 113.

Figure 17:
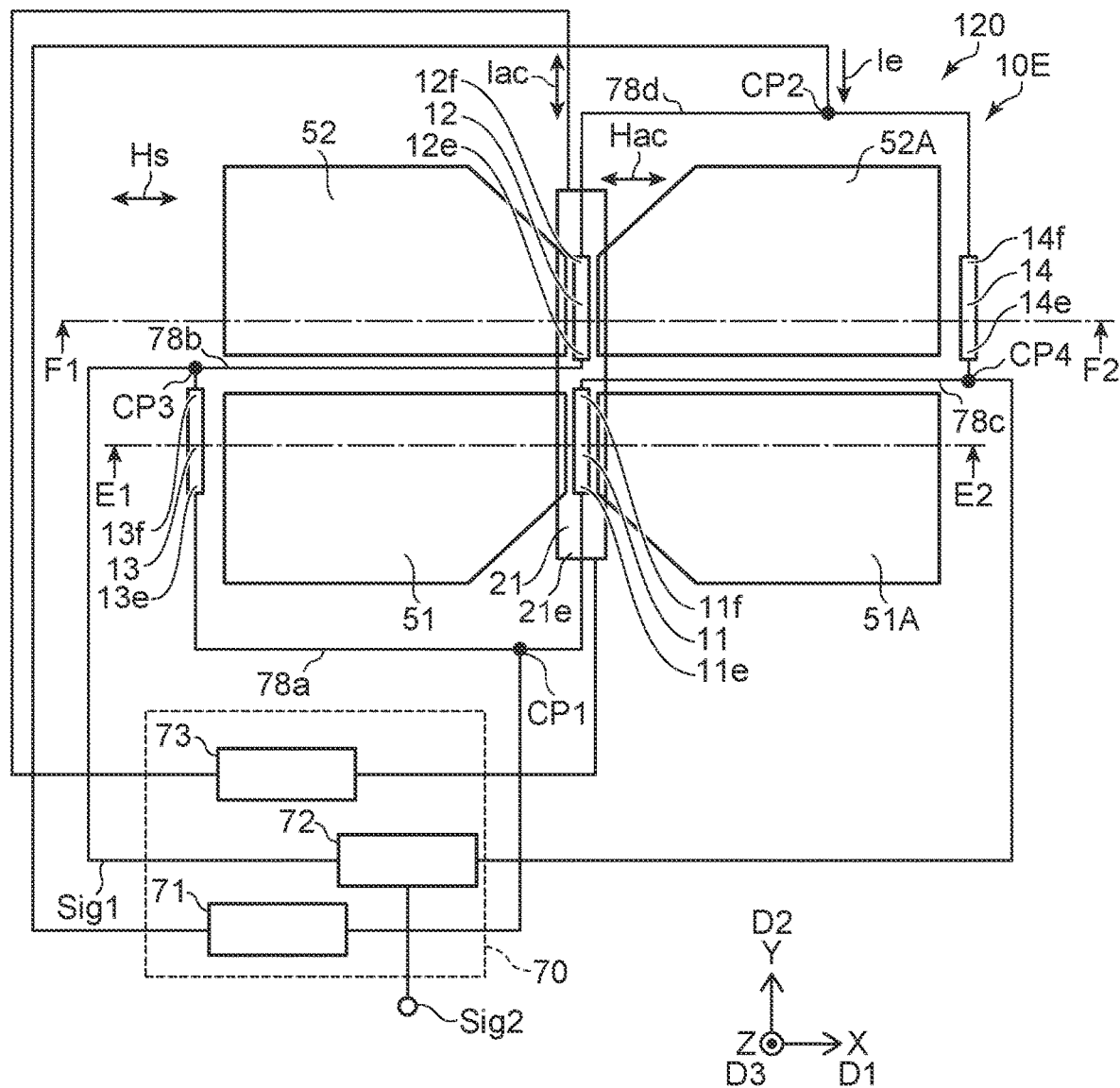
FIG. 17 is a schematic view illustrating the sensor according to the first embodiment.
Figure 18A:
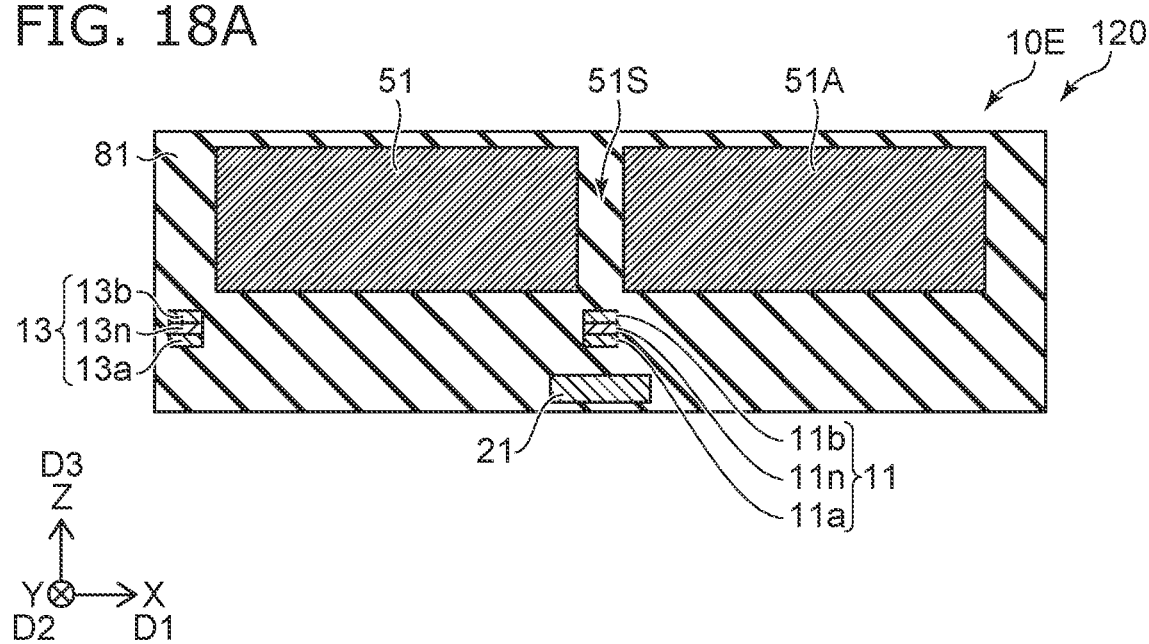
FIGS. 18A and 18B are schematic views illustrating the sensor according to the first embodiment.
Figure 18B:
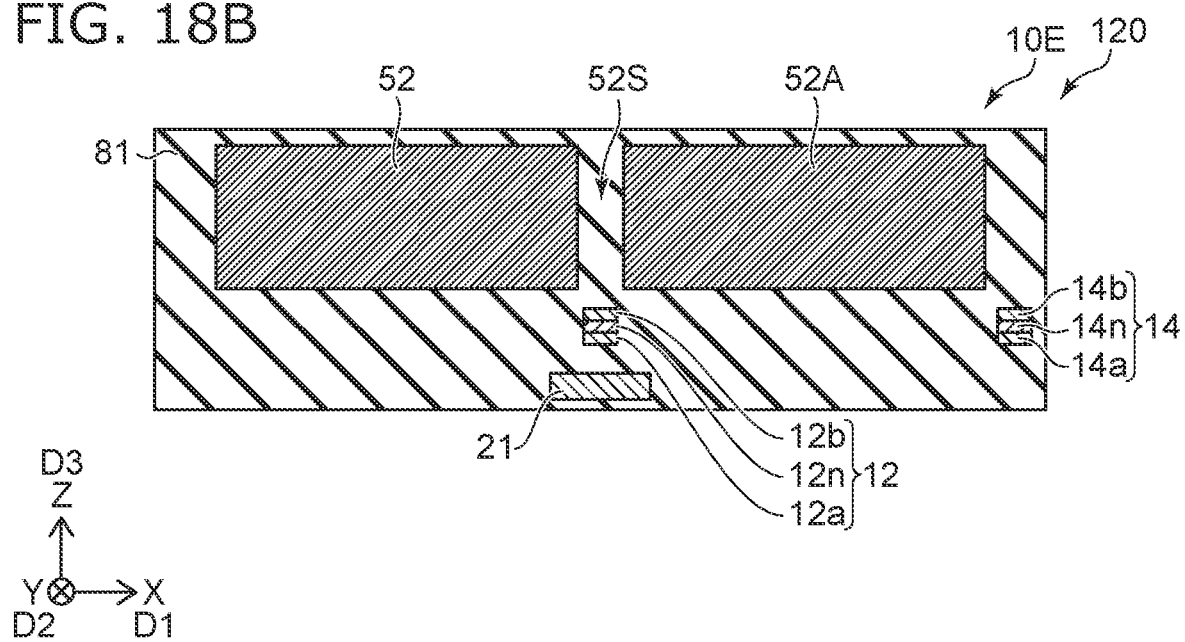

FIGS. 17, 18A and 18B are schematic views illustrating the sensor according to the first embodiment.

FIG. 17 is a plan view. FIG. 18A is a cross-sectional view taken along the line E1-E2 of FIG. 17. FIG. 18B is a sectional view taken along the line F1-F2 of FIG. 17.

As shown in FIG. 17, a sensor 120 according to the embodiment includes the element portion 10E. The element portion 10E includes a conductive member 21. Except for this, the configuration of the sensor 120 may be the same as the configuration of the above sensors (111, 111a to 111c, 112, 112a to 112c, 113 or 113a, etc.).

In the sensor 120, the conductive member current Iac flowing through the conductive member 21 is along the first element 11 and the second element 12.

As shown in FIG. 18A, for example, at least a part of the conductive member 21 may overlap the first element 11 in the third direction D3. As shown in FIG. 18B, for example, at least a part of the conductive member 21 may overlap the second element 12 in the third direction D3. For example, the direction from the conductive member 21 to the region 51S is along the third direction D3. The direction from the conductive member 21 to the region 52S is along the third direction D3.

As shown in FIG. 17, an AC circuit 73 is provided. The AC circuit 73 may be included in sensor 120. The AC circuit 73 may be included in the controller 70, for example.

The AC circuit 73 is configured to supply the conductive member current Iac to the conductive member 21. The conductive member current Iac includes an alternating component. A magnetic field Hac generated by the conductive member current Iac includes a component in the first direction D1.

The magnetic field Hac may be concentrated by the MFC and applied to the first element 11 and the second element 12. The electrical resistance of the first element 11 and the electrical resistance of the second element 12 change according to the target magnetic field Hs and the magnetic field Hac.

The electrical resistance of the first element 11 and the electrical resistance of the second element 12 may be changed in a substantially even function with respect to these magnetic fields. The period of the change in the electrical resistance of these elements is ½ times the period of the magnetic field Hac. The frequency of the change in the electrical resistance of these elements is 2 times the frequency of the magnetic field Hac. The period (frequency) of the magnetic field Hac is the same as the period (frequency) of the conductive member current Iac.

The detection circuit 72 is configured to output the output signal Sig2 obtained by processing the detection signal Sig1 based on the frequency of the conductive member current Iac. For example, the detection circuit 72 removes the frequency component that is 2 times of the frequency of the conductive member current Iac from the detection signal Sig1. The detection signal Sig1 includes the same frequency component as the frequency of the AC component included in the conductive member current Iac. The detection circuit 72 is configured to output, as the output signal Sig2, a value corresponding to the above "same frequency component" in the detection signal Sig1. The output signal Sig2 reflects the target magnetic field Hs. The detection circuit 72 may include, for example, a filter circuit. The detection circuit 72 may include, for example, a lock-in amplifier circuit. The lock-in amplifier circuit processes the detection signal Sig1 with reference to the frequency of the conductive member current Iac.

Second Embodiment

The second embodiment relates to an inspection device. As will be described later, the inspection device may include a diagnostic device.

Figure 19:
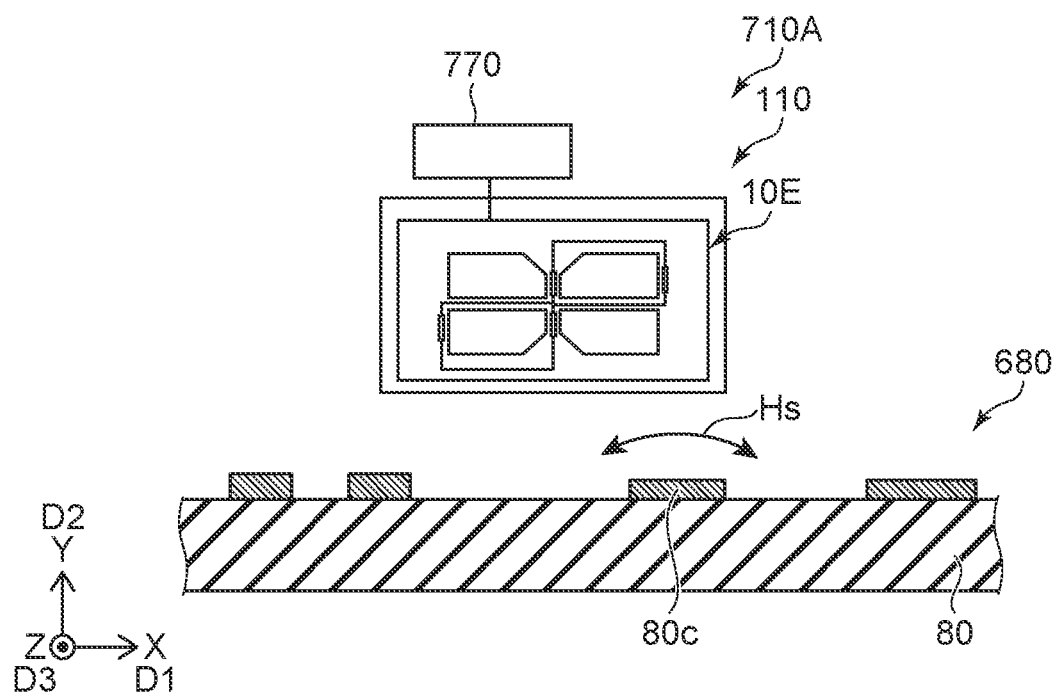
FIG. 19 is a schematic view showing an inspection device according to a second embodiment.

FIG. 19 is a schematic view showing an inspection device according to the second embodiment.

As shown in FIG. 19, an inspection device 710A according to the second embodiment includes the sensor (such as the sensor 110) according to the first embodiment and a processor 770. The processor 770 processes signals obtained from sensor 110. In the processor 770, the signal obtained from the sensor 110 and the reference value may be compared. The processor 770 is configured to output inspection results based on the processing results.

For example, an inspection object 680 is inspected by the inspection device 710A. The inspection object 680 is, for example, an electronic device (including semiconductor circuits and the like). The inspection object 680 includes, for example, the substrate 80 and the wiring 80c. The sensor 110 detects the detection target magnetic field Hs based on the current flowing through the wiring 80c. The detection target magnetic field Hs can be detected with high spatial position accuracy. For example, an abnormality in the wiring 80c can be detected with high positional accuracy.

Figure 20:
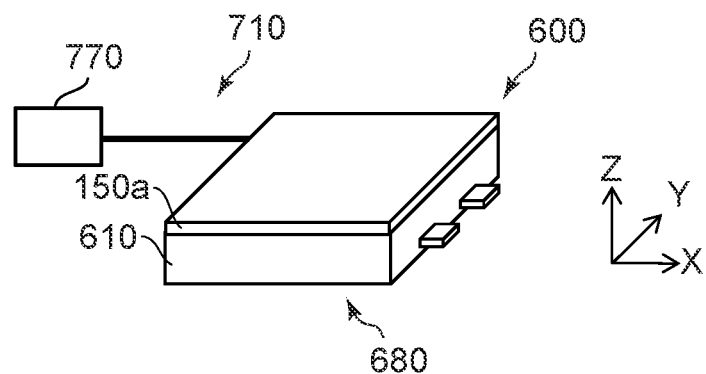
FIG. 20 is a schematic perspective view illustrating an inspection device according to the second embodiment.

FIG. 20 is a schematic perspective view illustrating an inspection device according to a second embodiment.

As shown in FIG. 20, an inspection device 710 according to the embodiment includes a sensor 150a (magnetic sensor) and a processor 770. The sensor 150a may be the sensor according to the first embodiment and a modification thereof. The processor 770 processes an output signal obtained from the sensor 150a. The processor 770 may compare the signal obtained from the sensor 150a with the reference value. The processor 770 can output the inspection result based on the processing result.

For example, the inspection device 710 inspects an inspection object 680. The inspection object 680 is, for example, an electronic device (including a semiconductor circuit or the like). The inspection object 680 may be, for example, a battery 610 or the like.

For example, the sensor 150a according to the embodiment may be used together with the battery 610. For example, a battery system 600 includes the battery 610 and the sensor 150a. The sensor 150a can detect the magnetic field generated by the current flowing through the battery 610.

Figure 21:
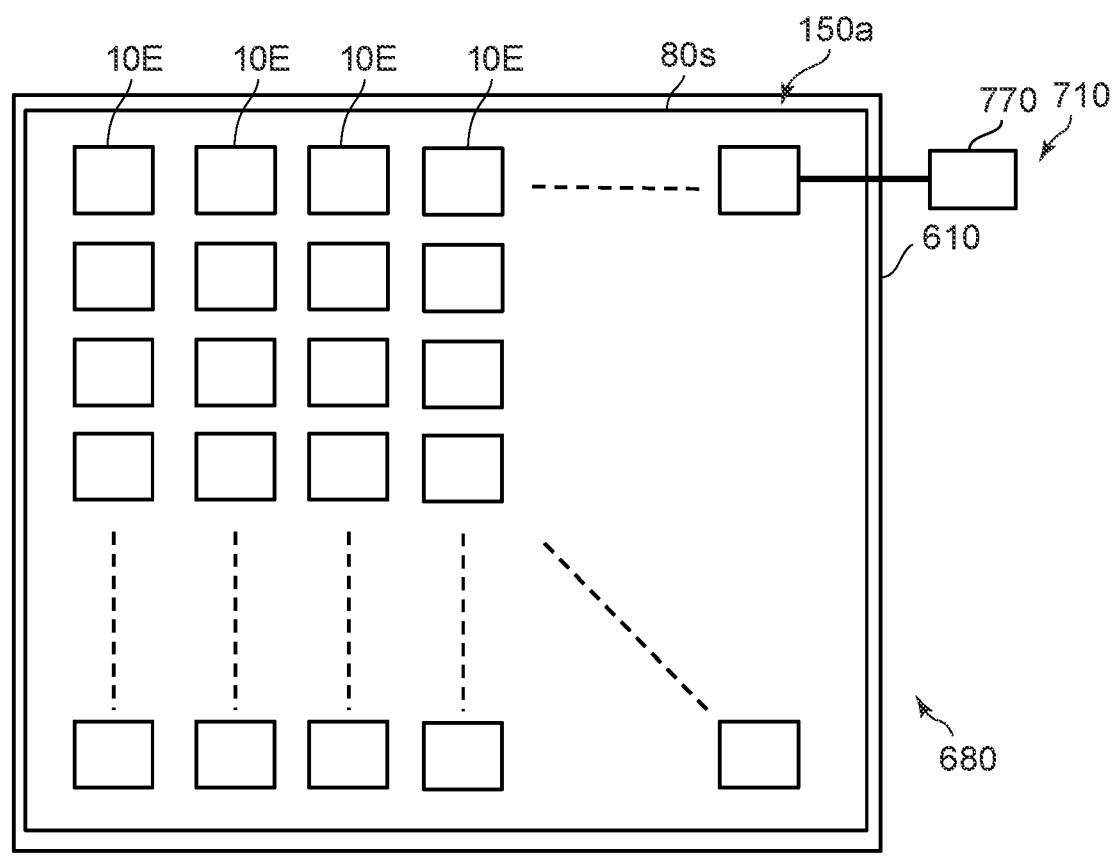
FIG. 21 is a schematic plan view illustrating the inspection device according to the second embodiment.

FIG. 21 is a schematic plan view illustrating the inspection device according to the second embodiment.

As shown in FIG. 21, the sensor 150a includes, for example, multiple sensors according to the embodiment. In this example, the sensor 150a includes multiple sensors (the element portion 10U such as the sensor 110, etc.). The multiple sensors are arranged along, for example, two directions (for example, the X-axis direction and the Y-axis direction). The multiple sensors 110 are provided, for example, on a substrate.

The sensor 150a can detect the magnetic field generated by the current flowing through the inspection object 680 (for example, the battery 610 may be used). For example, when the battery 610 approaches an abnormal state, an abnormal current may start to flow through the battery 610. By detecting the abnormal current with the sensor 150a, it is possible to know the change in the state of the battery 610. For example, in a state where the sensor 150a is placed close to the battery 610, the entire battery 610 can be inspected in a short time by moving the sensor array in two directions. The sensor 150a may be used for inspection of the battery 610 in manufacturing process of the battery 610.

The sensor according to the embodiment can be applied to, for example, the inspection device 710 such as a diagnostic device.

Figure 22:
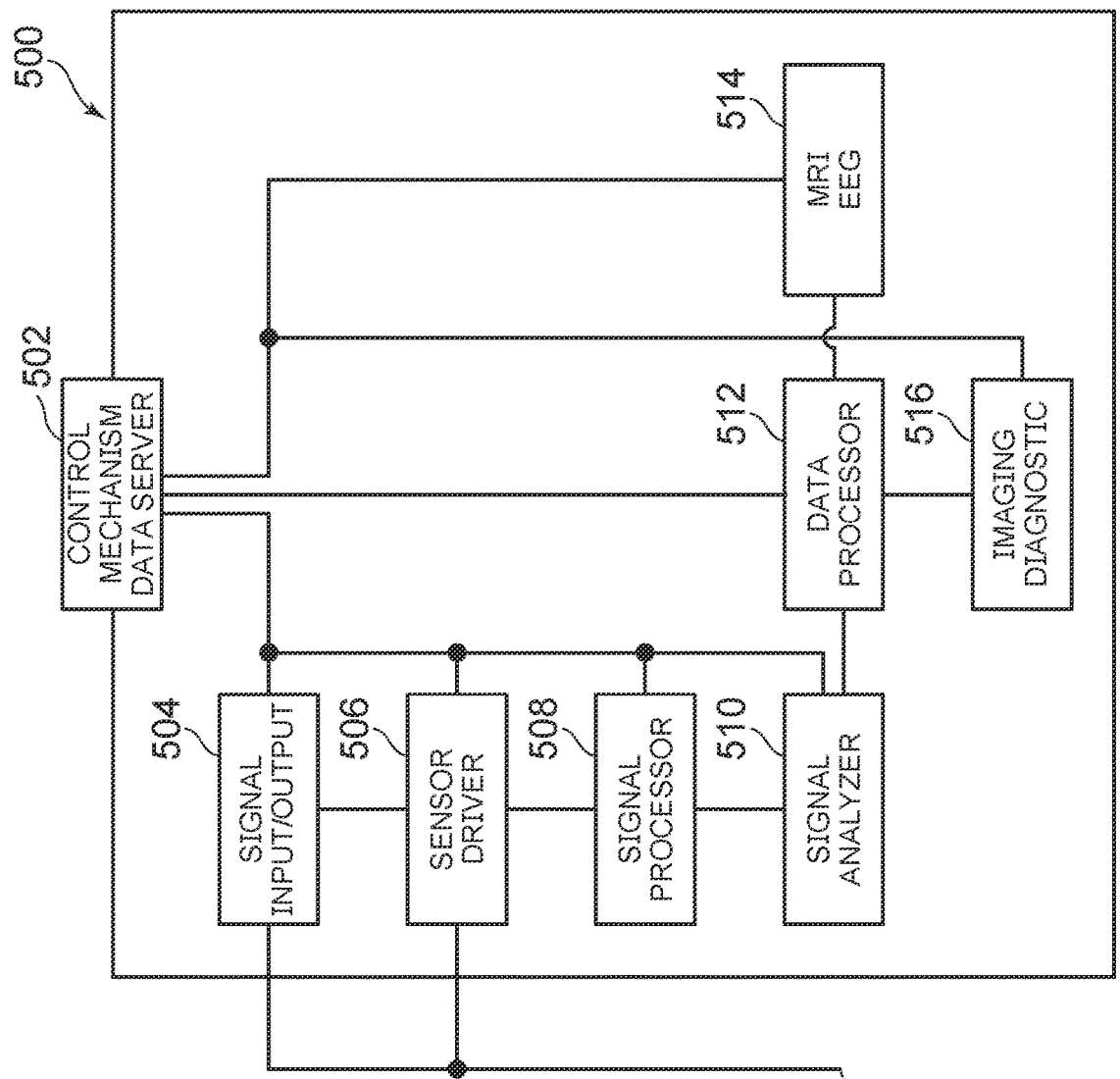
FIG. 22 is a schematic diagram illustrating the sensor and the inspection device according to the embodiment.

FIG. 22 is a schematic diagram illustrating the sensor and the inspection device according to the embodiment.

As shown in FIG. 22, a diagnostic apparatus 500, which is an example of the inspection device 710, includes a sensor 150. The sensor 150 includes the sensors described with respect to the first embodiment and modifications thereof.

In the diagnostic apparatus 500, the sensor 150 is, for example, a magnetoencephalograph. The magnetoencephalograph detects the magnetic field generated by the cranial nerves. When the sensor 150 is used in a magnetoencephalograph, the size of the magnetic element included in the sensor 150 is, for example, not less than 1 mm and less than 10 mm. This size is, for example, the length including an MFC.

As shown in FIG. 22, the sensor 150 (magnetoencephalogram) is attached to, for example, the head of a human body. The sensor 150 (magnetoencephalogram) includes a sensor part 301. The sensor 150 (magnetoencephalogram) may include multiple sensor parts 301. The number of the multiple sensor parts 301 is, for example, about 100 (for example, not less than 50 and not more than 150). The multiple sensor parts 301 are provided on a flexible base body 302.

The sensor 150 may include, for example, a circuit such as differential detection. The sensor 150 may include a sensor other than the sensor (for example, a potential terminal or an acceleration sensor).

A size of the sensor 150 is smaller than a size of a conventional SQUID sensor. Therefore, it is easy to install the multiple sensor parts 301. Installation of the multiple sensor parts 301 and other circuits is easy. The coexistence of the multiple sensor parts 301 and other sensors is easy.

The base body 302 may include an elastic body such as a silicone resin. For example, the multiple sensor parts 301 are provided to be connected to the base body 302. The base body 302 can be in close contact with the head, for example.

The input/output code 303 of the sensor part 301 is connected to a sensor driver 506 and a signal input/output 504 of the diagnostic apparatus 500. The magnetic field measurement is performed in the sensor part 301 based on the electric power from the sensor driver 506 and the control signal from the signal input/output 504. The result is input to the signal input/output 504. The signal obtained by the signal input/output 504 is supplied to a signal processor 508. The signal processor 508 performs processing such as noise removal, filtering, amplification, and signal calculation. The signal processed by the signal processor 508 is supplied to a signal analyzer 510. The signal analyzer 510 extracts, for example, a specific signal for magnetoencephalography measurement. In the signal analyzer 510, for example, signal analysis for matching signal phases is performed.

The output of the signal analyzer 510 (data for which signal analysis has been completed) is supplied to a data processor 512. The data processor 512 performs data analysis. In this data analysis, for example, image data such as MRI (Magnetic Resonance Imaging) can be incorporated. In this data analysis, for example, scalp potential information such as EEG (Electroencephalogram) can be incorporated. For example, a data part 514 such as MRI or EEG is connected to the data processor 512. By the data analysis, for example, nerve ignition point analysis, inverse problem analysis, and the like are performed.

The result of the data analysis is supplied to, for example, an imaging diagnostic 516. Imaging is performed in the imaging diagnostic 516. Imaging assists in diagnosis.

The above series of operations is controlled by, for example, a control mechanism 502. For example, necessary data such as primary signal data or metadata in the middle of data processing is stored in the data server. The data server and the control mechanism may be integrated.

The diagnostic apparatus 500 according to the embodiment includes the sensor 150 and the processor that processes an output signal obtained from the sensor 150. This processor includes, for example, at least one of a signal processor 508 or a data processor 512. The processor includes, for example, a computer.

In the sensor 150 shown in FIG. 22, the sensor part 301 is installed on the head of the human body. The sensor part 301 may be installed on the chest of the human body. This enables magnetocardiography measurement. For example, the sensor part 301 may be installed on the abdomen of a pregnant woman. This makes it possible to perform a fetal heartbeat test.

The sensor device including the subject is preferably installed in a shield room. Thereby, for example, the influence of geomagnetism or magnetic noise can be suppressed.

For example, a mechanism for locally shielding the measurement site of the human body or the sensor part 301 may be provided. For example, the sensor part 301 may be provided with a shield mechanism. For example, effective shielding may be performed in the signal analysis or the data processing.

In embodiments, the base body 302 may be flexible and may be substantially non-flexible. In the example shown in FIG. 22, the base body 302 is a continuous film processed into a hat shape. The base body 302 may be in a net shape. Thereby, for example, good wearability can be obtained. For example, the adhesion of the base body 302 to the human body is improved. The base body 302 may be helmet-shaped and may be rigid.

Figure 23:
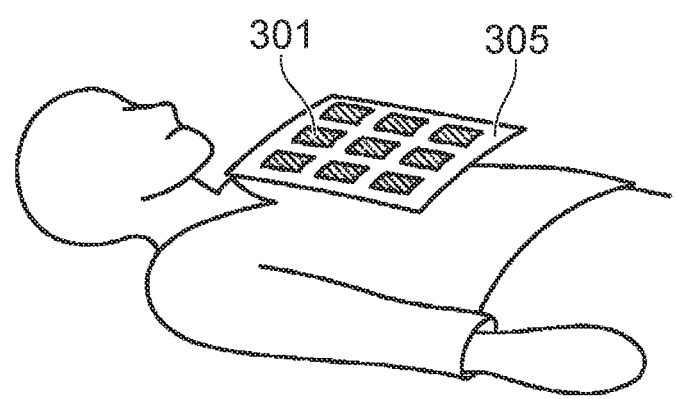
FIG. 23 is a schematic view illustrating the inspection device according to the embodiment.

FIG. 23 is a schematic view illustrating the inspection device according to the embodiment.

In the example shown in FIG. 23, the sensor part 301 is provided on a flat plate-shaped hard base body 305.

In the example shown in FIG. 23, the input/output of the signal obtained from the sensor part 301 is the same as the input/output described with respect to FIG. 23. In the example shown in FIG. 23, the processing of the signal obtained from the sensor part 301 is the same as the processing described with respect to FIG. 22.

There is a reference example of using a SQUID (Superconducting Quantum Interference Device) sensor as a device for measuring a weak magnetic field such as a magnetic field generated from a living body. In this reference example, since superconductivity is used, the device is large and the power consumption is also large. The burden on the measurement target (patient) is heavy.

According to the embodiment, the device can be downsized. Power consumption can be suppressed. The burden on the measurement object (patient) can be reduced. According to the embodiment, the SN ratio of magnetic field detection can be improved. Sensitivity can be improved.

The embodiments may include the following configurations (for example, technical proposals).

Configuration 1

A sensor, comprising an element portion,
the element portion including:
  a first magnetic member;
  a first opposing magnetic member, the first opposing magnetic member being separated from the first magnetic member in a first direction from the first magnetic member to the first opposing magnetic member;
  a first element including a first magnetic layer, a position of at least a part of the first element in the first direction being between a position of the first magnetic member in the first direction and a position of the first opposing magnetic member in the first direction, the first element including a first portion and a first other portion, a second direction from the first portion to the first other portion crossing the first direction,
  a second magnetic member, a direction from the first magnetic member to the second magnetic member being along the second direction;
  a second opposing magnetic member, the second opposing magnetic member being separated from the second magnetic member in the first direction, a direction from the first opposing magnetic member to the second opposing magnetic member being along the second direction;
  a second element including a second magnetic layer, a position of at least a part of the second element in the first direction being between a position of the second magnetic member in the first direction and a position of the second opposing magnetic member in the first direction, the second element including a second portion and a second other portion, a direction from the second portion to the second other portion being along the second direction;
  a third element including a third portion and a third other portion, a third portion being electrically connected to the first portion, the third other portion being electrically connected to the second portion; and
  a fourth element including a fourth portion and a fourth other portion, the fourth portion being electrically connected to the first other portion, the fourth other portion being electrically connected to the second other portion.

Configuration 2

The sensor according to Configuration 1, wherein a direction from the first element to the second element is along the second direction.

Configuration 3

The sensor according to Configuration 1 or 2, wherein
at least one of the position of the first magnetic member in the first direction or the position of the first opposing magnetic member in the first direction is between a position of the third element in the first direction and a position of the fourth element in the first direction, and
at least one of the position of the second magnetic member in the first direction or the position of the second opposing magnetic member in the first direction is between the position of the third element in the first direction and the position of the fourth element in the first direction.

Configuration 4

The sensor according to Configuration 1 or 2, wherein at least one of the position of the at least the part of the first element in the first direction or the position of the at least the part of the second element in the first direction is located between a position of the third element in the first direction and a position of the fourth element in the first direction.

Configuration 5

The sensor according to Configuration 1 or 2, wherein a position of the first magnetic member in the second direction and a position of the second magnetic member in the second direction are located between a position of the third element in the second direction and a position of the fourth element in the second direction.

Configuration 6

The sensor according to Configuration 1 or 2, wherein at least one of a position of the third element in the second direction or a position of the fourth element in the second direction is located between a position of the first magnetic member in the second direction and a position of the second magnetic member in the second direction.

Configuration 7

The sensor according to Configuration 1 or 2, wherein
an orientation from the third element to the first element is along the second direction, and
an orientation from the second element to the fourth element is along the second direction.

Configuration 8

The sensor according to any one of Configurations 1 to 7, wherein
  the first magnetic member includes a first outer portion and a first inner portion,
  the first opposing magnetic member includes a first opposing inner portion and a first opposing outer portion,
  the first inner portion is located between the first outer portion and the first opposing outer portion,
  the first opposing inner portion is located between the first inner portion and the first opposing outer portion,
  a length of the first inner portion along the second direction is shorter than a length of the first outer portion along the second direction,
  a length of the first opposing inner portion along the second direction is shorter than a length of the first opposing outer portion along the second direction,
  the second magnetic member includes a second outer portion and a second inner portion,
  the second opposing magnetic member includes a second opposing inner portion and a second opposing outer portion, the second inner portion is located between the second outer portion and the second opposing outer portion,
  the second opposing inner portion is located between the second inner portion and the second opposing outer portion,
  a length of the second inner portion along the second direction is shorter than a length of the second outer portion along the second direction, and a length of the second opposing inner portion along the second direction is shorter than a length of the second opposing outer portion along the second direction.

Configuration 9

The sensor according to any one of Configurations 1 to 8, wherein the third element and the fourth element do not overlap the first magnetic member, the first opposing magnetic member, the second magnetic member and the second opposing magnetic member in a third direction crossing a plane including the first direction and the second direction.

Configuration 10

The sensor according to Configuration 1 or 2, wherein at least one of the third element or the fourth element overlaps at least one of the first magnetic member, the first opposing magnetic member, the second magnetic member or the second opposing magnetic member in a third direction crossing a plane including the first direction and the second direction.

Configuration 11

The sensor according to any one of Configurations 1 to 8, wherein
  the first element further includes a first opposing magnetic layer,
  the second element further includes a second opposing magnetic layer, and
  at least one of a direction from the first magnetic layer to the first opposing magnetic layer or a direction from the second magnetic layer to the second opposing magnetic layer is along a third direction crossing a plane including the first direction and the second direction.

Configuration 12

The sensor according to any one of Configurations 1 to 11, wherein
  a length of the first element along the second direction is longer than a length of the first element along the first direction, and
  a length of the second element along the second direction is longer than a length of the second element along the first direction.

Configuration 13

The sensor according to any one of Configurations 1 to 12, wherein
  the third element includes a third magnetic layer and a third opposing magnetic layer, and
  the fourth element includes a fourth magnetic layer and a fourth opposing magnetic layer.

Configuration 14

The sensor according to any one of Configurations 1 to 13, wherein an electrical resistance of the first element and an electrical resistance of the second element are configured to be changed according to a magnetic field around the element portion.

Configuration 15

The sensor according to Configuration 14, wherein a change of an electrical resistance of the third element with respect to the magnetic field and a change of an electrical resistance of the fourth element with respect to the magnetic field are smaller than a change of the electrical resistance of the first element with respect to the magnetic field and smaller than a change of the electrical resistance of the second element with respect to the magnetic field.

Configuration 16

The sensor according to any one of Configurations 1 to 15, further comprising a conductive member,
  a conductive member current flowing through the conductive member being along the first element and the second element.

Configuration 17

The sensor according to Configuration 16, further comprising an AC circuit configured to supply the conductive member current to the conductive member,
  the conductive member current including an AC component, and
  a magnetic field based on the conductive member current including a component in the second direction.

Configuration 18

The sensor according to Configuration 17, further comprising:
  an element current circuit; and
  a detection circuit,
  the element current circuit being configured to supply an element current between a first connection point of the first portion and the third portion, and a second connection point of second other portion and the fourth other portion, and
  the detection circuit being configured to detect a detection signal generated between a third connection point of the third other portion and the second portion, and a fourth connection point of the first other portion and the fourth portion.

Configuration 19

The sensor according to Configuration 18, wherein the detection circuit is configured to output an output signal obtained by processing the detection signal based on a frequency of the conductive member current.

Configuration 20

An inspection device, comprising:
  the sensor according to any one of Configurations 1 to 19; and
  a processor configured to process an output signal obtained from the sensor.

According to the embodiments, it is possible to provide a sensor and an inspection device capable of improving characteristics.

In the present specification, "perpendicular" and "parallel" include not only strict perpendicularity and strict parallelism, but also variations in the manufacturing process, for example, and may be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the sensors or the inspection devices such as magnetic layers, magnetic elements, conductive members, controllers, processors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors and all inspection devices practicable by an appropriate design modification by one skilled in the art based on the sensors and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising an element portion, the element portion including:
   a first magnetic member;
   a first opposing magnetic member, the first opposing magnetic member being separated from the first magnetic member in a first direction from the first magnetic member to the first opposing magnetic member;
   a first element including a first magnetic layer, a position of at least a part of the first element in the first direction being between a position of the first magnetic member in the first direction and a position of the first opposing magnetic member in the first direction, the first element including a first portion and a first other portion, a second direction from the first portion to the first other portion crossing the first direction,
   a second magnetic member, a direction from the first magnetic member to the second magnetic member being along the second direction;
   a second opposing magnetic member, the second opposing magnetic member being separated from the second magnetic member in the first direction, a direction from the first opposing magnetic member to the second opposing magnetic member being along the second direction;
   a second element including a second magnetic layer, a position of at least a part of the second element in the first direction being between a position of the second magnetic member in the first direction and a position of the second opposing magnetic member in the first direction, the second element including a second portion and a second other portion, a direction from the second portion to the second other portion being along the second direction;
   a third element including a third portion and a third other portion, a third portion being electrically connected to the first portion, the third other portion being electrically connected to the second portion; and
   a fourth element including a fourth portion and a fourth other portion, the fourth portion being electrically connected to the first other portion, the fourth other portion being electrically connected to the second other portion, wherein
   at least one of the position of the first magnetic member in the first direction or the position of the first opposing magnetic member in the first direction is between a position of the third element in the first direction and a position of the fourth element in the first direction, and
   at least one of the position of the second magnetic member in the first direction or the position of the second opposing magnetic member in the first direction is between the position of the third element in the first direction and the position of the fourth element in the first direction.

2. The sensor according to claim 1, wherein a direction from the first element to the second element is along the second direction.

3. The sensor according to claim 1, wherein a position of the first magnetic member in the second direction and a position of the second magnetic member in the second direction are located between a position of the third element in the second direction and a position of the fourth element in the second direction.

4. The sensor according to claim 1, wherein at least one of a position of the third element in the second direction or a position of the fourth element in the second direction is located between a position of the first magnetic member in the second direction and a position of the second magnetic member in the second direction.

5. The sensor according to claim 1, wherein
   an orientation from the third element to the first element is along the second direction, and
   an orientation from the second element to the fourth element is along the second direction.

6. The sensor according to claim 1, wherein
   the first magnetic member includes a first outer portion and a first inner portion,
   the first opposing magnetic member includes a first opposing inner portion and a first opposing outer portion,
   the first inner portion is located between the first outer portion and the first opposing outer portion,
   the first opposing inner portion is located between the first inner portion and the first opposing outer portion,
   a length of the first inner portion along the second direction is shorter than a length of the first outer portion along the second direction,
   a length of the first opposing inner portion along the second direction is shorter than a length of the first opposing outer portion along the second direction,
   the second magnetic member includes a second outer portion and a second inner portion,
   the second opposing magnetic member includes a second opposing inner portion and a second opposing outer portion,
   the second inner portion is located between the second outer portion and the second opposing outer portion,
   the second opposing inner portion is located between the second inner portion and the second opposing outer portion,
   a length of the second inner portion along the second direction is shorter than a length of the second outer portion along the second direction, and
   a length of the second opposing inner portion along the second direction is shorter than a length of the second opposing outer portion along the second direction.

7. The sensor according to claim 1, wherein the third element and the fourth element do not overlap the first magnetic member, the first opposing magnetic member, the second magnetic member and the second opposing magnetic member in a third direction crossing a plane including the first direction and the second direction.

8. The sensor according to claim 1, wherein
   the first element further includes a first opposing magnetic layer,
   the second element further includes a second opposing magnetic layer, and at least one of a direction from the first magnetic layer to the first opposing magnetic layer or a direction from the second magnetic layer to the second opposing magnetic layer is along a third direction crossing a plane including the first direction and the second direction.

9. The sensor according to claim 1, wherein
a length of the first element along the second direction is longer than a length of the first element along the first direction, and
a length of the second element along the second direction is longer than a length of the second element along the first direction.

10. The sensor according to claim 1, wherein
the third element includes a third magnetic layer and a third opposing magnetic layer, and
the fourth element includes a fourth magnetic layer and a fourth opposing magnetic layer.

11. The sensor according to claim 1, wherein an electrical resistance of the first element and an electrical resistance of the second element are configured to be changed according to a magnetic field around the element portion.

12. The sensor according to claim 11, wherein a change of an electrical resistance of the third element with respect to the magnetic field and a change of an electrical resistance of the fourth element with respect to the magnetic field are smaller than a change of the electrical resistance of the first element with respect to the magnetic field and smaller than a change of the electrical resistance of the second element with respect to the magnetic field.

13. The sensor according to claim 1, further comprising a conductive member,
a conductive member current flowing through the conductive member being along the first element and the second element.

14. The sensor according to claim 13, further comprising an AC circuit configured to supply the conductive member current to the conductive member,
the conductive member current including an AC component, and
a magnetic field based on the conductive member current including a component in the first direction.

15. The sensor according to claim 14, further comprising:
an element current circuit; and
a detection circuit,
the element current circuit being configured to supply an element current between a first connection point of the first portion and the third portion, and a second connection point of second other portion and the fourth other portion, and
the detection circuit being configured to detect a detection signal generated between a third connection point of the third other portion and the second portion, and a fourth connection point of the first other portion and the fourth portion.

16. The sensor according to claim 15, wherein the detection circuit is configured to output an output signal obtained by processing the detection signal based on a frequency of the conductive member current.

17. An inspection device, comprising:
the sensor according to claim 1; and
a processor configured to process an output signal obtained from the sensor.

18. A sensor, comprising an element portion,
the element portion including:
a first magnetic member;
a first opposing magnetic member, the first opposing magnetic member being separated from the first magnetic member in a first direction from the first magnetic member to the first opposing magnetic member;
a first element including a first magnetic layer, a position of at least a part of the first element in the first direction being between a position of the first magnetic member in the first direction and a position of the first opposing magnetic member in the first direction, the first element including a first portion and a first other portion, a second direction from the first portion to the first other portion crossing the first direction,
a second magnetic member, a direction from the first magnetic member to the second magnetic member being along the second direction;
a second opposing magnetic member, the second opposing magnetic member being separated from the second magnetic member in the first direction, a direction from the first opposing magnetic member to the second opposing magnetic member being along the second direction;
a second element including a second magnetic layer, a position of at least a part of the second element in the first direction being between a position of the second magnetic member in the first direction and a position of the second opposing magnetic member in the first direction, the second element including a second portion and a second other portion, a direction from the second portion to the second other portion being along the second direction;
a third element including a third portion and a third other portion, a third portion being electrically connected to the first portion, the third other portion being electrically connected to the second portion; and
a fourth element including a fourth portion and a fourth other portion, the fourth portion being electrically connected to the first other portion, the fourth other portion being electrically connected to the second other portion,
wherein at least one of the position of the at least the part of the first element in the first direction or the position of the at least the part of the second element in the first direction is located between a position of the third element in the first direction and a position of the fourth element in the first direction.

19. A sensor, comprising an element portion,
the element portion including:
a first magnetic member;
a first opposing magnetic member, the first opposing magnetic member being separated from the first magnetic member in a first direction from the first magnetic member to the first opposing magnetic member;
a first element including a first magnetic layer, a position of at least a part of the first element in the first direction being between a position of the first magnetic member in the first direction and a position of the first opposing magnetic member in the first direction, the first element including a first portion and a first other portion, a second direction from the first portion to the first other portion crossing the first direction,
a second magnetic member, a direction from the first magnetic member to the second magnetic member being along the second direction;

a second opposing magnetic member, the second opposing magnetic member being separated from the second magnetic member in the first direction, a direction from the first opposing magnetic member to the second opposing magnetic member being along the second direction;

a second element including a second magnetic layer, a position of at least a part of the second element in the first direction being between a position of the second magnetic member in the first direction and a position of the second opposing magnetic member in the first direction, the second element including a second portion and a second other portion, a direction from the second portion to the second other portion being along the second direction;

a third element including a third portion and a third other portion, a third portion being electrically connected to the first portion, the third other portion being electrically connected to the second portion; and a fourth element including a fourth portion and a fourth other portion, the fourth portion being electrically connected to the first other portion, the fourth other portion being electrically connected to the second other portion, wherein at least one of the third element or the fourth element overlaps at least one of the first magnetic member, the first opposing magnetic member, the second magnetic member or the second opposing magnetic member in a third direction crossing a plane including the first direction and the second direction.

* * * * *